(12) United States Patent
Kim et al.

(10) Patent No.: US 11,735,702 B2
(45) Date of Patent: Aug. 22, 2023

(54) LIGHT-EMITTING ELEMENT PACKAGE AND LIGHT SOURCE MODULE

(71) Applicant: SUZHOU LEKIN SEMICONDUCTOR CO., LTD., Taicang (CN)

(72) Inventors: Won Jung Kim, Seoul (KR); June O Song, Seoul (KR); Yeong June Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 396 days.

(21) Appl. No.: 17/261,405

(22) PCT Filed: Jul. 19, 2019

(86) PCT No.: PCT/KR2019/008945
§ 371 (c)(1),
(2) Date: Jan. 19, 2021

(87) PCT Pub. No.: WO2020/017922
PCT Pub. Date: Jan. 23, 2020

(65) Prior Publication Data
US 2021/0257529 A1    Aug. 19, 2021

(30) Foreign Application Priority Data
Jul. 20, 2018  (KR) .......................... 10-2018-0084580

(51) Int. Cl.
*H01L 33/62* (2010.01)
*H01L 25/16* (2023.01)
(Continued)

(52) U.S. Cl.
CPC ............ *H01L 33/62* (2013.01); *H01L 25/167* (2013.01); *H01L 33/483* (2013.01); *H01L 33/60* (2013.01);
(Continued)

(58) Field of Classification Search
CPC ....... H01L 33/483; H01L 33/62; H01L 33/60; H01L 25/167; H01L 33/647; H01L 2224/48245
See application file for complete search history.

(56) References Cited

U.S. PATENT DOCUMENTS

2004/0016873 A1   1/2004  Kida et al.
2012/0286310 A1  11/2012  Kim et al.
(Continued)

FOREIGN PATENT DOCUMENTS

JP    2005-317646 A   11/2005
JP       6164087 B2    7/2017
(Continued)

*Primary Examiner* — Feifei Yeung Lopez
(74) *Attorney, Agent, or Firm* — Birch, Stewart, Kolasch & Birch, LLP

(57) ABSTRACT

A light-emitting element package according to an embodiment comprises: a body comprising a cavity; the cavity; a first frame and a second frame arranged on the bottom surface of the cavity; a first metal layer disposed on the first frame; an ultraviolet light-emitting element disposed on the first metal layer; and a second metal layer disposed on the second frame and electrically connected to the second frame, wherein the body comprises a separation portion between the first frame and the second frame, the second metal layer extends over the sloping surface of the cavity and the separation portion of the body, and the second metal layer is spaced apart from the first metal layer in the cavity and surrounds the first metal layer.

20 Claims, 24 Drawing Sheets

(51) Int. Cl.
  *H01L 33/60* (2010.01)
  *H01L 33/64* (2010.01)
  *H01L 33/48* (2010.01)
  *H01L 23/00* (2006.01)
  *H01L 33/32* (2010.01)

(52) U.S. Cl.
  CPC ............ *H01L 33/647* (2013.01); *H01L 24/48* (2013.01); *H01L 33/32* (2013.01); *H01L 2224/48245* (2013.01); *H01L 2924/12041* (2013.01)

(56) References Cited

U.S. PATENT DOCUMENTS

2017/0155024 A1* 6/2017 Yu ........................... H01L 33/62
2019/0103517 A1  4/2019 Kim
2019/0189870 A1* 6/2019 Ichinokura ............. H01L 33/40

FOREIGN PATENT DOCUMENTS

| KR | 10-1053937 B1 | 8/2011 |
| KR | 10-2011-0116632 A | 10/2011 |
| KR | 10-1316009 B1 | 10/2013 |
| KR | 10-2013-0123088 A | 11/2013 |
| KR | 10-1403247 B1 | 6/2014 |
| WO | WO 2017/164644 A1 | 9/2017 |

* cited by examiner

LIGHT-EMITTING ELEMENT PACKAGE AND LIGHT SOURCE MODULE

CROSS REFERENCE TO RELATED APPLICATIONS

This application is the National Phase of PCT/KR2019/008945 filed on Jul. 19, 2019, which claims priority under 35 U.S.C. § 119(a) to patent application Ser. No. 10-2018-0084580 filed in the Republic of Korea on Jul. 20, 2018, all of which are hereby expressly incorporated by reference into the present application.

TECHNICAL FIELD

An embodiment relates to a light-emitting element package and a light source module including the same.

BACKGROUND ART

A semiconductor device including compounds such as GaN and AlGaN has a lot of advantages such as having wide and easily adjustable band distance energy and may be used variously as a light-emitting device, a light-receiving device, and various diodes.

In particular, a light-emitting device such as a light-emitting diode or a laser diode using a compound semiconductor material of Group III-V or Group II-VI of a semiconductor has an advantage that may realize light of various wavelength bands such as red, green, blue, and ultraviolet rays by development of thin film growth technology and device materials. In particular, a light-emitting device such as a light-emitting diode or a laser diode using a compound semiconductor material of Group III-V or Group II-VI of a semiconductor may realize a white light source with high efficiency by using fluorescent materials or combining colors. Such a light-emitting device has advantages of low power consumption, semi-permanent lifetime, fast response speed, safety, and environmental friendliness as compared with conventional light sources such as fluorescent lamps and incandescent lamps.

In addition, when a light-receiving device such as a photodetector or a solar cell is manufactured using a compound semiconductor material of Group III-V or Group II-VI, by developing device materials, light of various wavelength regions from gamma rays to a radio wavelength region may be utilized by absorbing light of various wavelength regions and generating a photocurrent. In addition, such a light-receiving device has advantages of fast response speed, safety, environmental friendliness and easy control of device materials, so that it may be easily used for power control or a microwave circuit or communication module.

Accordingly, a semiconductor device has been expanded to a transmitting module of an optical communication means, a light-emitting diode backlight which replaces a cold cathode fluorescent lamp (CCFL) constituting a backlight of a liquid crystal display (LCD) device, white light-emitting diode lighting device which may replace the fluorescent lamp or the incandescent lamp, automotive headlights, traffic lights, and even sensors sensing gas or fire. In addition, the semiconductor device may be extended to high-frequency application circuits or other power control devices, and even communication modules.

A light-emitting device (LED) may be provided, for example, as a p-n junction diode having a characteristic in which electric energy is converted into light energy by using Group III-V or Group II-V elements on the periodic table, and may realize various wavelengths by adjusting a composition ratio of a compound semiconductor.

For example, a nitride semiconductor has received a great interest in a development field of an optical device and a high-power electronic device due to high thermal stability and wide band distance energy thereof. In particular, an ultraviolet (UV) LED, a blue LED, a green LED, a yellow LED, a red LED, and the like using the nitride semiconductor are commercialized and used widely.

For example, an UV LED is a light-emitting diode that emits light distributed in a wavelength band of 200 nm to 400 nm, in the wavelength band, a short wavelength may be used for sterilization, purification, or the like, and a long wavelength may be used for an exposure apparatus, a curing apparatus, or the like.

Ultraviolet rays may be classified into three categories of UV-A 315 nm to 400 nm), UV-B 280 nm to 315 nm), and UV-C 200 nm to 280 nm) in a descending order of wavelength. The UV-A 315 nm to 400 nm) region is applied to various fields such as industrial UV curing, printing ink curing, an exposure apparatus, counterfeit discrimination, photocatalytic sterilization, a special lighting system (aquarium/agriculture, etc.), and the like. The UV-B 280 nm to 315 nm) region is used for medical applications, and the UV-C 200 nm to 280 nm) region is applied to air purification, water purification, sterilization products, and the like.

Meanwhile, as a light-emitting device capable of providing high output is required, research is being conducted on a light-emitting device capable of increasing output by applying high power.

In addition, research is being conducted on a package having improved light resistance, which may prevent the package from being discolored by light emitted from a light-emitting device.

In addition, research is being conducted on a package that may prevent cracks from occurring inside the package due to light emitted from a light-emitting device and improve reliability.

In addition, in a light-emitting element package, research is being conducted on improving light extraction efficiency of a light-emitting device.

In addition, research is being conducted on a light-emitting element package capable of effectively discharging heat emitted from a light-emitting device.

In addition, research is being conducted on a method for reducing a manufacturing cost and improving a manufacturing yield by changing a structure.

DISCLOSURE

Technical Problem

An object of an embodiment is to provide a light-emitting element package and a light source module capable of preventing a body from being discolored by light emitted from a light-emitting device.

In addition, another object of an embodiment is to provide a light-emitting element package and a light source module capable of preventing cracks from occurring on a body due to light emitted from a light-emitting device.

In addition, still another object of an embodiment is to provide a light-emitting element package and a light source module capable of guiding light emitted from a light-emitting device in an upward direction to improve light efficiency and luminous flux.

In addition, still another object of an embodiment is to provide a light-emitting element package and a light source module capable of efficiently discharging heat emitted from a light-emitting device.

In addition, still another object of an embodiment is to provide a light-emitting element package and a light source module capable of preventing a short circuit between frames and having improved electrical characteristics.

In addition, still another object of an embodiment is to provide a light-emitting element package and a light source module in which a body may contain various materials.

In addition, yet another object of an embodiment is to provide a light-emitting element package and a light source module capable of preventing an open failure of a wire connecting a light-emitting device and a metal layer.

Technical Solution

A light-emitting element package according to an embodiment includes a body including a cavity, the cavity, first and second frames disposed on a bottom surface of the cavity, a first metal layer disposed on the first frame, an ultraviolet light-emitting device disposed on the first metal layer, and a second metal layer disposed on the second frame and electrically connected to the second frame, wherein the body includes a separation portion between the first frame and the second frame, the second metal layer extends over an inclined surface of the cavity and the separation portion of the body, and the second metal layer is spaced apart from the first metal layer in the cavity and surrounds the first metal layer.

In addition, a light-emitting element package according to an embodiment includes a first frame and a second frame spaced apart from each other, a body disposed between the first frame and the second frame, a metal layer disposed on the body and having a cavity, and a light-emitting device disposed in the cavity, wherein the metal layer includes a through-hole disposed on a bottom surface of the cavity, the metal layer is electrically connected to the first frame, and the light-emitting device is electrically connected to the second frame disposed inside the through-hole and the metal layer.

Advantageous Effects

An embodiment includes a metal layer disposed on a body, and it is possible to minimize that light emitted from a light-emitting device is incident on the body by the metal layer. Accordingly, it is possible to prevent the body from being discolored by the light, and to prevent cracks from occurring in the body. Therefore, it is possible to improve reliability of a light-emitting element package, and to use a body made of various materials.

In addition, in the embodiment, the light emitted from the light-emitting device may be effectively reflected by disposing the metal layer on the body. In addition, the body may further include a partition wall portion protruding upward from an upper surface of the body, and the metal layer may be disposed on the partition wall portion. Accordingly, it possible to improve light efficiency and luminous flux of the light-emitting element package.

Further, in the embodiment, the metal layer may be disposed between a frame and the light-emitting device to provide a heat dissipation path. Accordingly, heat emitted from the light-emitting device may be effectively discharged, and thus heat dissipation characteristics of the light-emitting element package may be improved.

In addition, in the embodiment, a through portion may be disposed between metal layers having different polarities, and the upper surface of the body may be exposed by the through portion. Accordingly, it is possible to prevent an electrical short between the metal layers having different polarities and the frame, and thus it is possible to improve the reliability of the light-emitting element package.

Further, in the embodiment, it is possible to reduce a linear distance between both ends of a wire connecting the light-emitting device and the metal layer, and a difference in a height between the both ends. Accordingly, it is possible to prevent an open failure of the wire connecting the light-emitting device and the metal layer.

MODES OF THE INVENTION

Figure 1:
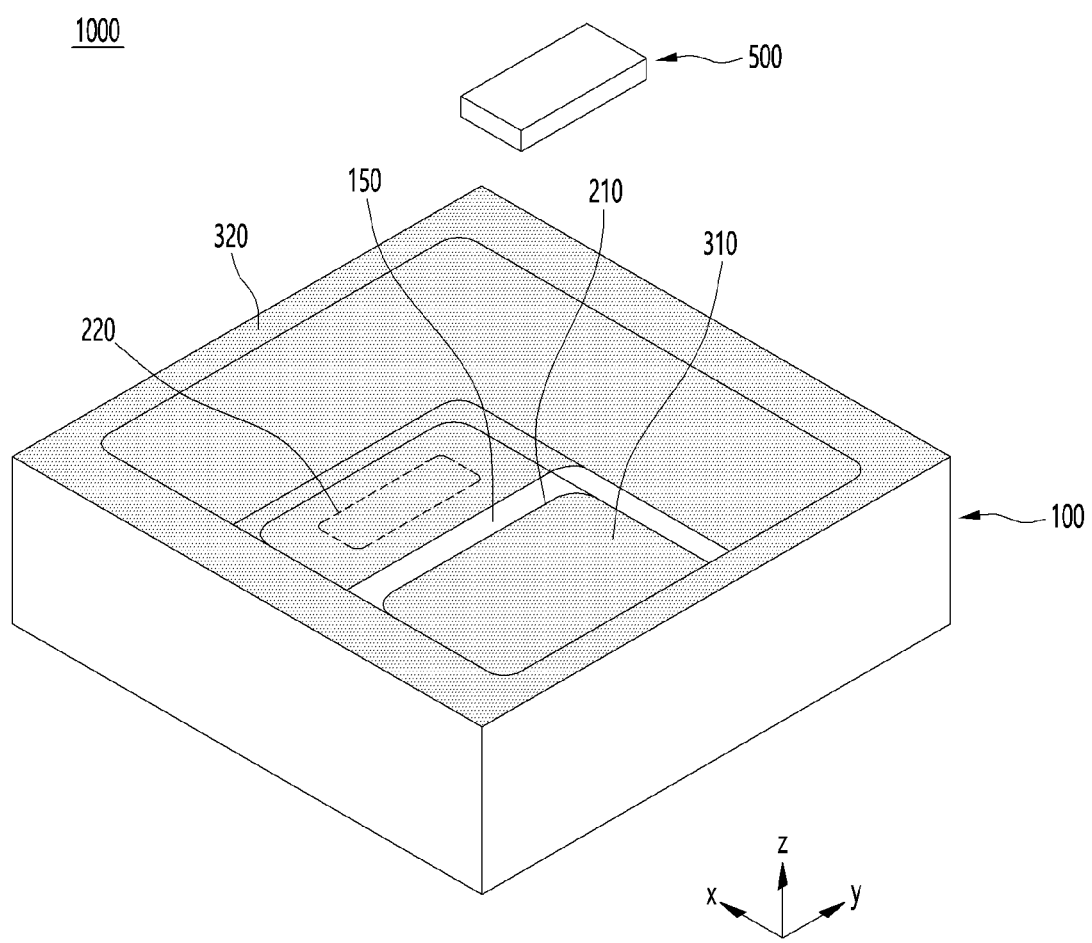
FIG. 1 is a perspective view of a light-emitting element package according to an embodiment.

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

In addition, in describing the elements of the embodiments of the present invention, the terms such as first, second, A, B, (A, and (b) may be used. These terms are only used to distinguish the elements from other elements, and the terms are not limited to the essence, order, or order of the elements. Further, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements. Furthermore, when expressed as "on (over)" or "under (below)", it may include not only the upper direction but also the lower direction based on one element.

A light-emitting element package according to an embodiment is a semiconductor element package, and a semiconductor device of the light-emitting element package may include a light-emitting device that emits ultraviolet light, infrared light, or visible light. Hereinafter, it will be described based on a case in which a light-emitting device is applied as an example of a semiconductor device, and a package or a light source device to which the light-emitting device is applied may include a non-light-emitting device, for example, an element such as a Zener diode, or a sensing device monitoring a wavelength or heat. Hereinafter, it will be described based on a case in which the light-emitting device is applied will be described as an example of the semiconductor device, and the light-emitting element package will be described in detail.

In addition, prior to describing the light-emitting element package according to the embodiment of the invention, a first direction may be an x-axis direction shown in the drawings, and a second direction may be a y-axis direction shown in the drawings, and may be a direction orthogonal to the x-axis direction. Further, a third direction may be a z-axis direction shown in the drawings, and may be a direction orthogonal to the x-axis and the y-axis.

Figure 2:
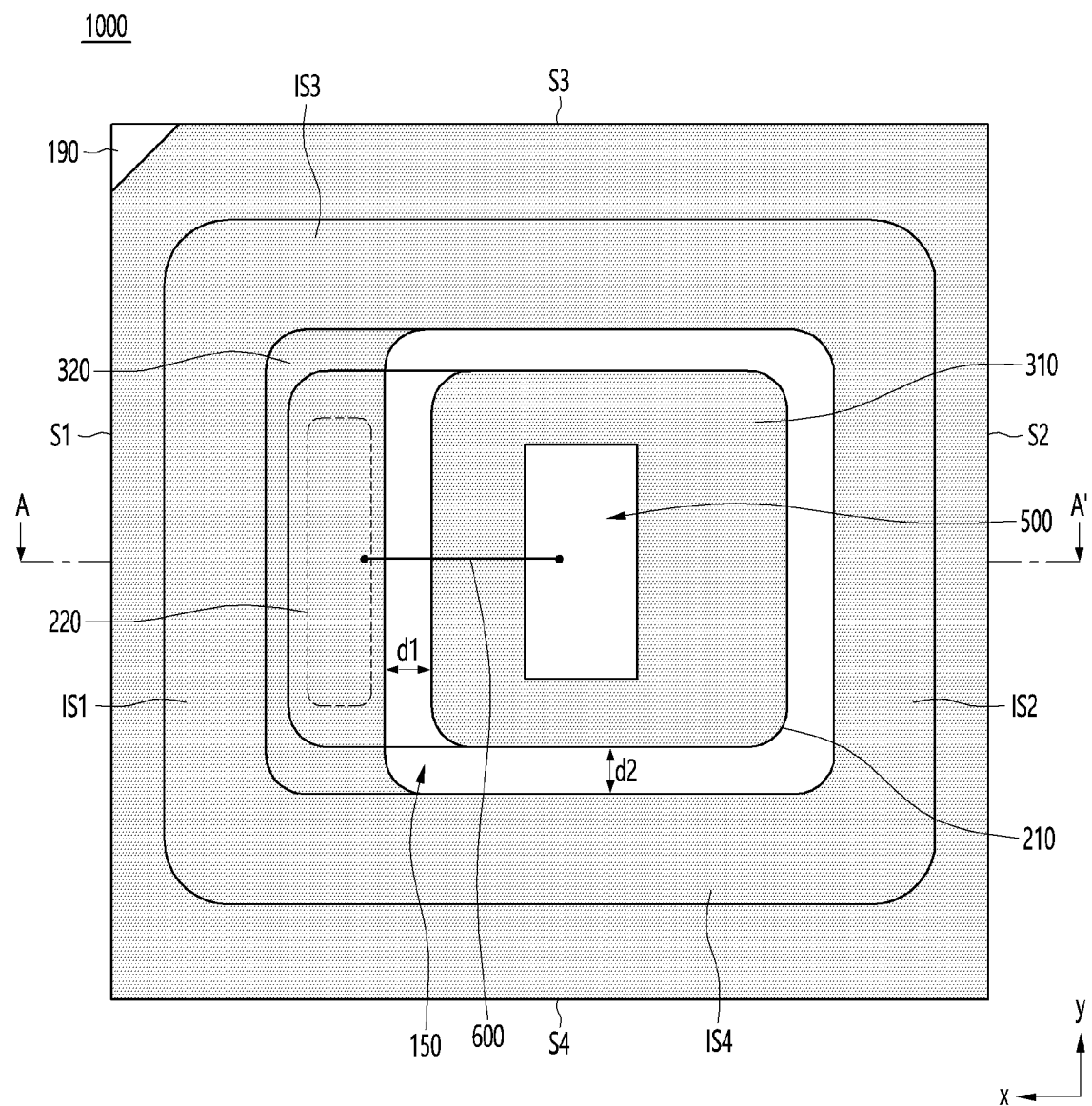
FIG. 2 is a plan view of a light-emitting element package according to an embodiment.
Figure 3:
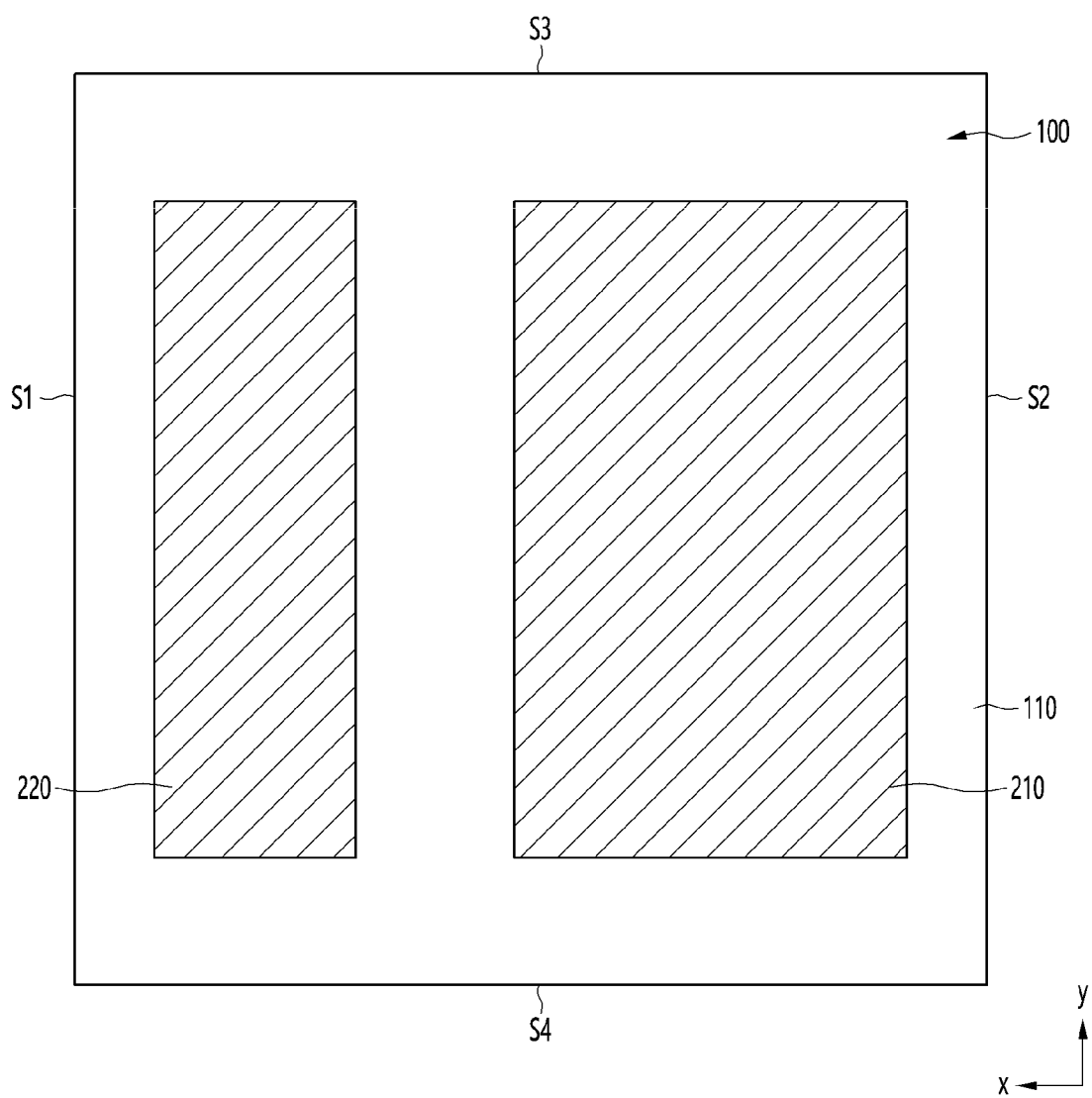
FIG. 3 is a rear view of a light-emitting element package according to an embodiment.
Figure 4:
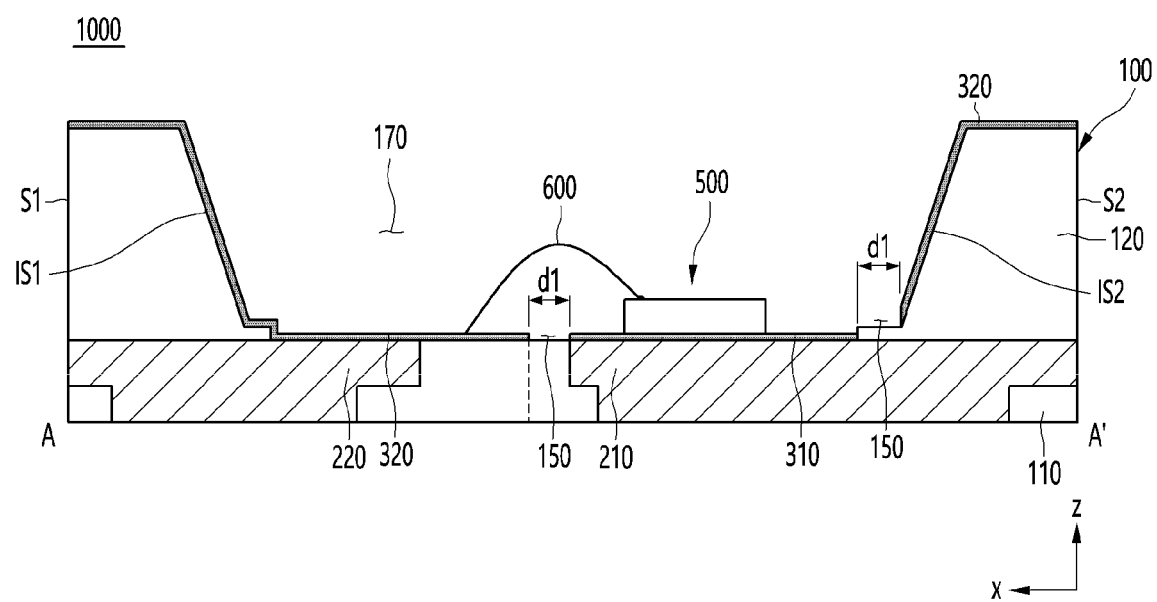
FIG. 4 is a cross-sectional view taken along line A-A' of the light-emitting element package of FIG. 2.

FIG. 1 is a perspective view of a light-emitting element package according to an embodiment, and FIG. 2 is a plan view of a light-emitting element package according to an embodiment. In addition, FIG. 3 is a rear view of a light-emitting element package according to an embodiment, and FIG. 4 is a cross-sectional view taken along line A-A' of the light-emitting element package of FIG. 2.

Referring to FIGS. 1 to 7, a light-emitting element package 1000 according to an embodiment may include a body 100, frames 210 and 220, metal layers 310 and 320, and a light-emitting device 500.

The light-emitting element package 1000 may have lengths in a first direction and a second direction. The length in the first direction of the light-emitting element package 1000 may be the same as or different from the length in the second direction. For example, the length in the first direction of the light-emitting element package 1000 may be longer than or equal to the length in the second direction. As an example, when the light-emitting element package 1000 is viewed in a plane, the light-emitting element package 1000 may have a square shape or a rectangular shape.

The body 100 may be made of a resin material or an insulating resin material. The body 100 may be formed of at least one selected from the group consisting of polyphthalamide (PPA), polychloro triphenyl (PCT), liquid crystal polymer (LCP), polyamide9T (PAST), silicone, epoxy, epoxy molding compound (EMC), silicone molding compound (SMC), ceramic, photo sensitive glass (PSG), sapphire ($Al_2O_3$), and the like. The body 100 may be made of a resin material and may contain a filler of a high refraction material such as $TiO_2$ and $SiO_2$. The body 100 may be formed of a thermoplastic resin, and since the thermoplastic resin is a material that recedes when heated and hardens again when cooled, the body 100 may act as a buffer when the frames 210 and 220 described later and materials in contact therewith expand or contract due to heat. At this time, when the body 100 acts as the buffer, it is possible to prevent a conductive portion such as a solder paste, a silver (Ag) paste, and a SAC (Sn—Ag—Cu) paste from being damaged. The coefficient of thermal expansion (CTE) according to the thermal expansion and contraction of the package may be larger in the first direction than in the second direction. The body 100 according to the embodiment may include a PCT or PPA material which is a thermoplastic resin having a high melting point.

An electrode position indicator 190 may be formed at polychloride least one of four corners of an upper end portion of the body 100. For example, the electrode position indicator 190 may be formed for indicating at least one polarity of the cathode or the anode, and may be formed by cutting one corner of the body 100 in a stepped shape.

The body 100 may include a plurality of side surfaces. In detail, the body 100 may include a first side surface S1 and a second side surface S2 facing each other in the first direction, and may include a third side surface S3 and a fourth side surface S4 facing each other in the second direction. The third side surface S3 and the fourth side surface S4 may be a side surface that connects the first side surface S1 and the second side surface S2. For example, the third side surface S3 may be extended in the first direction from one end of the first side surface S1 to be connected to one end of the second side surface S2. Further, the fourth side surface S4 may be extended in the first direction from the other end of the first side surface S1 to be connected to the other end of the second side surface S2. The first to fourth side surfaces S1, S2, S3, and S4 may be a surface perpendicular or inclined with respect to a lower surface of the body 100.

A length of the body 100 in the first direction may be different from or the same as a length in the second direction. For example, when the length in the first direction of the light-emitting element package 1000 is longer than the length in the second direction thereof, the length in the first direction of the body 100 may be longer than the length in the second direction. That is, lengths in the second direction of the first and second side surfaces S1 and S2 may be shorter than lengths in the first direction of the third and fourth side surfaces S3 and S4. Further, when the lengths in the first and second directions of the light-emitting element package 1000 are the same, the lengths of the body 100 in the first and second directions may be the same. That is, the lengths in the first direction or the second direction of the first to fourth side surfaces S1, S2, S3, and S4 may be the same as each other.

The body 100 may include a first body portion 110 and a second body portion 120. For example, the body 100 may include the first body portion 110 and the second body portion 120 disposed on the first body portion 110. The second body portion 120 may be disposed around an upper surface of the first body portion 110. The second body portion 120 may provide an inclined surface on the first body portion 110. Accordingly, the second body portion 120 may provide a cavity 170 on the upper surface of the first body portion 110. Here, the second body portion 120 may be referred to as an upper body. That is, the second body portion 120 may be a side wall that provides the cavity 170. The first body portion 110 and the second body portion 120 may be formed integrally or separately. When the first body portion 110 and the second body portion 120 are formed separately, an adhesive material is applied between the first body portion 110 and the second body portion 120 to be coupled to each other. A part of the upper surface of the first body portion 110 may be exposed by the cavity 170.

The second body portion 120 may include an inclined surface and an upper surface. The inclined surface of the second body portion 120 may be an inner surface of the second body portion 120. In detail, the second body portion 120 may include inclined inner surfaces IS1, IS2, IS3, and IS4 inclined around the cavity 170 and an upper surface connected to the inner surfaces IS1, IS2, IS3, and IS4. The inner surface of the second body portion 120 may be a surface facing the light-emitting device 500. The inner surface of the second body portion 120 may be a surface toward the light-emitting device 500. The inclined inner surfaces IS1, IS2, IS3, and IS4 may be inner surfaces inclined in the first and second directions. For example, the second body portion 120 may include a first inner surface IS1 and a second inner surface IS2 inclined in the first direction, and may include a third inner surface IS3 and a fourth inner surface IS4 inclined in the second direction. The first inner surface IS1 and the second inner surface IS2 may be surfaces facing in the first direction. The third inner surface IS3 and the fourth inner surface IS4 may be surfaces facing in the second direction.

The first inner surface IS1 may be a surface adjacent to a second frame 220 to be described later. For example, the first inner surface IS1 may be a surface adjacent to the second frame 220 of a bottom surface of the cavity 170 in the first direction. The second inner surface IS2 may be a surface adjacent a first frame 210 to be described later. The second inner surface IS2 may be a surface adjacent to the first frame 210 of the bottom surface of the cavity 170 in the first direction. The third inner surface IS3 and the fourth inner surface IS4 may be surfaces adjacent to the second frame 220 of the bottom surface of the cavity 170 in the second direction. Further, the third inner surface IS3 and the fourth inner surface IS4 may be surfaces adjacent to the first frame 210 of the bottom surface of the cavity 170 in the second direction. A distance between the first frame 210 and the third inner surface IS3 at the bottom surface of the cavity 170 may be shorter than a distance between the second frame 220 and the third inner surface IS3. Further, a distance between the first frame 210 and the fourth inner surface IS4 at the bottom surface of the cavity 170 may be shorter than a distance between the second frame 220 and the fourth inner surface IS4.

Inclination angles of the first inner surface IS1 and the second inner surface IS2 may be different from each other.

The inclination angles of the first inner surface IS1 and the second inner surface IS2 may be different from each other depending on areas of the frames 210 and 220 exposed to the bottom surface of the cavity 170. For example, the light-emitting element package 1000 may include the second frame 220 adjacent to the first inner surface IS1, and the first frame 210 adjacent to the second inner surface IS2. At this time, when the area of the first frame 210 exposed to the bottom surface of the cavity 170 is larger than that of the second frame 220, the inclination angle of the first inner surface IS1 may be larger than that of the second inner surface IS2. Here, the inclination angle may refer to an angle between the first body portion 110 exposed to the bottom surface of the cavity 170 and each inclined surface. In addition, inclination angles of the third inner surface IS3 and the fourth inner surface IS4 may correspond to each other. That is, the third and fourth inner surfaces IS3 and IS4 may have inclination angles corresponding to each other with respect to the upper surface of the first body portion 110. In this case, the light-emitting device 500 may be positioned at a center of the first body portion 110. Accordingly, a distance from a center of the light-emitting device 500 to a boundary between the first body portion 110 and the first inner surface IS1 may correspond to a distance to a boundary between the first body portion 110 and the second inner surface IS2. Further, a distance from the center of the light-emitting device 500 to a boundary between the first body portion 110 and the third inner surface IS3 may correspond to a distance to a boundary between the first body portion 110 and the fourth inner surface IS4. That is, the inclination angles of the first inner surface IS1 and the second inner surface IS2 may be different from each other depending on the area of the exposed frame, thereby minimizing light loss and increasing luminous flux by improving light extraction efficiency.

Alternatively, the inclination angles of the first inner surface IS1 and the second inner surface IS2 may correspond to each other. That is, the first and second inner surfaces IS1 and IS2 may have inclination angles corresponding to each other with respect to the upper surface of the first body portion 110. Further, the inclination angles of the third inner surface IS3 and the fourth inner surface IS4 may correspond to each other. That is, the third and fourth inner surfaces IS3 and IS4 may have the inclination angles corresponding to each other with respect to the upper surface of the first body portion 110. The inclination angles of the first to fourth inner surfaces IS1, IS2, IS3, and IS4 may correspond to each other. Alternatively, the inclination angles of the first to fourth inner surfaces IS1, IS2, IS3, and IS4 may be different from each other. For example, inner surfaces facing each other may have inclination angles corresponding to each other, and adjacent inner surfaces may have different inclination angles. In detail, the inclination angles of the first and second inner surfaces IS1 and IS2 may correspond to each other, the inclination angles of the third and fourth inner surfaces IS3 and IS4 may correspond to each other, and the inclination angles of the first and second inner surfaces IS1 and IS2 may be different from the inclination angles of the third and fourth inner surfaces IS3 and IS4.

Each of the first to fourth inner surfaces IS1, IS2, IS3, and IS4 may be a flat surface. In addition, each of the first to fourth inner surfaces IS1, IS2, IS3, and IS4 may include at least one of a flat surface and a curved surface. For example, when the area of the first frame 210 exposed to the bottom surface of the cavity 170 is larger than that of the second frame 220, the first inner surface IS1 may be a curved surface, and the second to fourth inner surfaces IS2, IS3, and IS4 may be flat surfaces. In addition, in such an above case, the first inner surface IS1 may include both a flat surface and a curved surface, and the second to fourth inner surfaces IS2, IS3, and IS4 may be flat surfaces.

A thickness of the first body portion 110 may be about 400 µm or less. In detail, the thickness of the first body portion 110 may be about 80 µm to about 400 µm. In more detail, the thickness of the first body portion 110 may be about 100 µm to about 300 µm.

In addition, the total thickness of the body 100 may be about 100 µm or more. In detail, the thickness of the body 100 may be about 100 µm to about 800 µm. The thickness of the body 100 may refer to a sum of the thickness of the first body portion 110 and a thickness of the second body portion 120. The thickness of the second body portion 120 may be thicker than that of the light-emitting device 500. An upper surface of the second body portion 120 may be disposed at the same position as or higher than an upper surface of the light-emitting device 500 for a light directional angle distribution. Alternatively, although not shown in the drawings, the second body portion 120 may be removed from the first body portion 110. Accordingly, the light-emitting element package may have a light directional angle distribution of 130 degrees or more.

The light-emitting element package 1000 may include a plurality of frames. For example, the light-emitting element package 1000 may include the first frame 210 and the second frame 220. The first frame 210 and the second frame 220 may be disposed to be spaced apart from each other on the bottom surface of the cavity 170. For example, the first frame 210 and the second frame 220 may be disposed to be spaced apart from each other in the first direction. In addition, the body 100 may support the first and second frames 210 and 220. For example, the first body portion 110 may support the first and second frames 210 and 220.

The first frame 210 and the second frame 220 may be provided as conductive frames. The conductive frame may be selected from a metal such as copper (Cu), titanium (Ti), nickel (Ni), gold (Au), chromium (Cr), tantalum (Ta), platinum (Pt), tin (Sn), and silver (Ag), and may be formed as a single layer or multiple layers.

The first frame 210 and the second frame 220 may have a thickness in consideration of heat dissipation characteristics and electric conduction characteristics. For example, the thickness of each of the first and second frames 210 and 220 may be about 100 µm to about 300 µm. The thickness of the first frame 210 may correspond to the thickness of the second frame 220. For example, the first frame 210 and the second frame 220 may have the same thickness within the above-described thickness range. In addition, the thicknesses of the first frame 210 and the second frame 220 may correspond to the thickness of the first body portion 110. As the first frame 210 and the second frame 220 are provided as metal frames, structural strength of the body 100 may be stably provided.

The first and second frames 210 and 220 may have different polarities. For example, the first frame 210 may be connected to a P-type electrode of the light-emitting device 500, and the second frame 220 may be connected to an N-type electrode of the light-emitting device 500. Alternatively, the first frame 210 may be connected to the N-type electrode of the light-emitting device 500, and the second frame 220 may be connected to the P-type electrode of the light-emitting device 500.

The body 100 may be disposed between the first and second frames 210 and 220. A separation portion of the body 100 may be disposed between the first and second frames 210 and 220. The separation portion may be a part of the first body portion 110. The first body portion 110 may support the first and second frames 210 and 220. The separation portion may be separated from the first and second frames 210 and 220. The separation portion may be referred to as an insulating member. In addition, the separation portion may be exposed by spacing apart first and second metal layers 310 and 320 to be described later. In detail, the first and second metal layers 310 and 320 may be spaced apart from each other on the body 100, and a through portion 150 exposing an upper surface of the body 100 may be disposed between the first and second metal layers 310 and 320. The through portion 150 may be positioned on the separation portion. In detail, the through portion 150 may be positioned on a region overlapped with the separation portion in a vertical direction. The through portion 150 may be positioned on at least one of the first and second body portions 110 and 120. For example, the through portion 150 may be formed only on the first body portion 110 depending on a position in which the first and second metal layers 310 and 320 are disposed, and may be formed on the inclined surfaces of the first body portion 110 and the second body portion 120. Accordingly, the through portion 150 may function as an electrode separation line between the first and second frames 210 and 220. In addition, the through portion 150 may function as an electrode separation line between the first and second metal layers 310 and 320 to be described later.

The first and second frames 210 and 220 may have lengths in first and second directions. In detail, the first and second frames 210 and 220 exposed by the cavity 170 may have lengths in the first and second directions. The length in the first direction of the first frame 210 exposed by the cavity 170 may correspond to the length in the second direction. In addition, the length in the first direction of the second frame 220 exposed by the cavity 170 may be different from the length in the second direction. For example, the length in the first direction of the second frame 220 exposed by the cavity 170 may be shorter than the length in the second direction.

In addition, the length in the first direction of the first frame 210 exposed by the cavity 170 may be different from the length in the first direction of the second frame 220. For example, the length of the first frame 210 in the first direction may be longer than the length of the second frame 220 in the first direction. In addition, the length of the first frame 210 in the second direction may be longer than or equal to the length of the second frame 220 in the second direction.

Areas of the first and second frames 210 and 220 exposed by the cavity 170 may be different from each other. For example, the area of the first frame 210 exposed by the cavity 170 may be larger than that of the second frame 220 exposed by the cavity 170.

An upper surface of the first frame 210 may be disposed on different planes from the upper surface of the first body portion 110. For example, the upper surface of the first frame 210 may be disposed below the upper surface of the first body portion 110 in the vertical direction. However, the embodiment is not limited thereto, and the upper surface of the first frame 210 may be disposed on the same plane as the upper surface of the first body portion 110. In addition, a bottom surface of the first frame 210 may be disposed on the same plane as a bottom surface of the first body portion 110.

An upper surface of the second frame 220 may be disposed on a different plane from the upper surface of the first body portion 110. For example, the upper surface of the second frame 220 may be disposed below the upper surface of the first body portion 110 in the vertical direction. However, the embodiment is not limited thereto, and the upper surface of the second frame 220 may be disposed on the same plane as the upper surface of the first body portion 110. In addition, the upper surface of the second frame 220 may be disposed on the same plane as the upper surface of the first frame 210. A bottom surface of the second frame 220 may be disposed on the same plane as the bottom surface of the first body portion 110. The bottom surface of the second frame 220 may be disposed on the same plane as the bottom surface of the first frame 210.

The first and second frames 210 and 220 may be exposed by the cavity 170. For example, a part of the upper surface of each of the first and second frames 210 and 220 may be exposed by the cavity 170. In this case, the area of the first frame 210 exposed by the cavity 170 may be different from the area of the second frame 220. For example, the area of the first frame 210 exposed by the cavity 170 may be larger than the area of the second frame 220.

The light-emitting element package 1000 may include a plurality of metal layers. For example, the light-emitting element package 1000 may include a first metal layer 310 and a second metal layer 320 respectively disposed on the first frame 210 and the second frame 220.

The first metal layer 310 and the second metal layer 320 may include at least one selected from the group consisting of silver (Ag), copper (Cu), gold (Au), platinum (Pt), and aluminum (Al). The first metal layer 310 and the second metal layer 320 may include the same material among the groups described above. Preferably, the first metal layer 310 and the second metal layer 320 may include gold (Au).

Each of the first and second metal layers 310 and 320 may be a single layer. However, the embodiment is not limited thereto, and each of the first and second metal layers 310 and 320 may include a plurality of layers.

Thicknesses of the first and second metal layers 310 and 320 may be about 0.8 µm to about 1.2 µm. In detail, the thicknesses of the first and second metal layers 310 and 320 may be about 0.9 µm to about 1.1 µm. In more detail, the thicknesses of the first and second metal layers 310 and 320 may be about 0.95 µm to about 1.05 µm. When the thicknesses of the first and second metal layers 310 and 320 are less than about 0.8 µm, an effect of effectively discharging heat emitted from the light-emitting device 500 may be lowered, and electrical conduction characteristics may be deteriorated. In addition, when the thicknesses of the first and second metal layers 310 and 320 exceed about 1.2 µm, a space inside the cavity 170 is narrowed, so that it may be difficult to secure a region in which the light-emitting device 500 may be disposed, and a manufacturing time and a manufacturing cost may be increased. Therefore, it is preferable that the thicknesses of the first and second metal layers 310 and 320 satisfy the above-described range in consideration of heat dissipation characteristics and electrical characteristics. The thickness of each of the first and second metal layers 310 and 320 may correspond to each other within the above-described range.

The metal layers 310 and 320 may be formed on the body 100. In addition, the metal layers 310 and 320 may have the above-described cavity 170 as they are disposed on the upper surface of the body 100. In addition, the metal layers 310 and 320 may include the through portion 150 disposed on the bottom surface of the cavity 170.

Referring to FIG. 4, the first metal layer 310 may be disposed on the first frame 210. The first metal layer 310 may be disposed at a position vertically overlapped with the first frame 210. The first metal layer 310 may be in direct contact with the upper surface of the first frame 210. In addition, the first metal layer 310 may be disposed on the upper surface of the body 100 exposed by the cavity 170. For example, the first metal layer 310 may be disposed on the upper surface of the first body portion 110 exposed by the cavity 170. In addition, the first metal layer 310 may be disposed to be spaced apart from a separation portion of the first body portion 110. The first metal layer 310 may be disposed to be spaced apart from the second frame 220. The first metal layer 310 may be disposed to be spaced apart from the second body portion 120. The first metal layer 310 may be disposed to be spaced apart from the first to fourth inner surfaces IS1, IS2, IS3, and IS4.

The first metal layer 310 may have lengths in a first direction and a second direction. The length of the first metal layer 310 in the first direction may be the same as or different from the length in the second direction. In addition, the lengths in the first direction and in the second direction of the first metal layer 310 may correspond to lengths in the first and second directions of the first frame 210 exposed by the cavity 170, respectively. Accordingly, an area of the first metal layer 310 may correspond to an area of the upper surface of the first frame 210 in the cavity 170. The first metal layer 310 may be disposed to cover the entire upper surface of the first frame 210 exposed by the cavity 170.

The second metal layer 320 may be disposed to be spaced apart from the first metal layer 310. The second metal layer 320 may be disposed on the second frame 220. The second metal layer 320 may be disposed at a position vertically overlapped with the second frame 220. The second metal layer 320 may be in direct contact with the upper surface of the second frame 220. The second metal layer 320 may be disposed on the upper surface of the body 100 exposed by the cavity 170. For example, the second metal layer 320 may be disposed on the upper surface of the first body portion 110 disposed on a lower surface of the cavity 170. The second metal layer 320 may be disposed on the separation portion of the body 100. In addition, the second metal layer 320 may be disposed on the first to fourth inner surfaces IS1, IS2, IS3, and IS4 formed by the cavity 170. In detail, the second metal layer 320 may be disposed at a position vertically overlapped with the first to fourth inner surfaces IS1, IS2, IS3, and IS4. The second metal layer 320 may be in direct contact with the first to fourth inner surfaces IS1, IS2, IS3, and IS4. The second metal layer 320 may be disposed on the entire region of the first to fourth inner surfaces IS1, IS2, IS3, and IS4. The second metal layer 320 disposed on the first to fourth inner surfaces IS1, IS2, IS3, and IS4 may have different inclination angles. For example, when the area of the first frame 210 exposed to the bottom surface of the cavity 170 is larger than that of the second frame 220, the inclination angle of the first inner surface IS1 may be larger than that of the second inner surface IS2. Accordingly, the second metal layer 320 disposed on the first inner surface IS1 and the second inner surface IS2 may correspond to an inclination angle of the inner surface. Therefore, an inclination angle of the second metal layer 320 disposed on the first inner surface IS1 may be greater than that of the second metal layer 320 disposed on the second inner surface IS2. Here, the inclination angle of the second metal layer 320 may refer to an inclination angle between the second metal layer 320 disposed on the upper surface of the first body portion 110 and the second metal layer 320 disposed on the inner surface.

In addition, the second metal layer 320 may be disposed on the upper surface of the body 100, for example, the upper surface of the second body portion 120. The second metal layer 320 may be disposed at a position vertically overlapped with the upper surface of the second body portion 120. The second metal layer 320 may be in direct contact with the upper surface of the second body portion 120. The second metal layer 320 may be disposed on the entire region of the upper surface of the second body portion 120. In addition, the second metal layer 320 may be disposed to be spaced apart from the first frame 210.

That is, the second metal layer 320 may be extended on the second frame 220 onto the inner surface of the cavity 170 and the separation portion of the body 100. In detail, it may be extended to the upper surface of the first body portion 110, the inner surface of the second body portion 120, and the upper surface of the second body portion 120. The second metal layer 320 may be disposed to be connected to each other on the upper surface of the second frame 220, a part of the upper surface of the first body portion 110, the first to fourth inner surfaces IS1, IS2, IS3, and IS4, and the upper surface of the second body portion 120. The second metal layer 320 may be spaced apart from the first metal layer 310 in the cavity 170, and may be disposed surrounding the first metal layer 310. In detail, the second metal layer 320 may be disposed surrounding the first metal layer 310 on the upper surface of the first body portion 110 and the inner surface of the second body portion 120. The second metal layer 320 may surround the first metal layer 310, and may be disposed to cover the entire region of the upper surface of the second frame 220, a partial region of the upper surface of the first body portion 110, the entire region of the first to fourth inner surfaces IS1, IS2, IS3, and IS4, and the entire region of the upper surface of the second body portion 120. Accordingly, the first metal layer 310, the second metal layer 320, the first frame 210, and the second frame 220 may be electrically separated.

The second metal layer 320 may have lengths in a first direction and a second direction. The length of the second metal layer 320 in the first direction may be longer than that of the second frame 220 exposed by the cavity 170 in the first direction. The length of the second metal layer 320 in the second direction may be longer than that of the second frame 220 exposed by the cavity 170 in the second direction. In addition, the length in the first direction of the second metal layer 320 may correspond to the length in the first direction of the body 100. Further, the length of the second metal layer 320 in the second direction may correspond to the length of the body 100 in the second direction.

An area of the second metal layer 320 may be larger than that of the upper surface of the second frame 220 exposed by the cavity 170. Accordingly, the second metal layer 320 may be disposed to cover the entire region of the upper surface of the second frame 220 exposed by the cavity 170. In addition, the area of the second metal layer 320 may be larger than that of a lower surface of the second frame 220 exposed to the lower surface of the body 100. Further, the area of the second metal layer 320 may be larger than that of the first metal layer 310. For example, the area of the second metal layer 320 may be 110% or more of the area of the first metal layer 310.

A distance between the second metal layers 320 disposed on the first to fourth inner surfaces IS1, IS2, IS3, and IS4 may be changed. In detail, when the first to fourth inner surfaces IS1, IS2, IS3, and IS4 are disposed to be inclined with respect to the upper surface of the first body portion 110, the distance between the second metal layers 320 disposed on the inner surfaces IS1, IS2, IS3, and IS4 may be changed. For example, the distance between the second metal layers 320 disposed on inner surfaces facing each other may be changed toward a vertical direction (a third direction). A distance between the second metal layer 320 disposed on the first inner surface IS1 and the second metal layer 320 disposed on the second inner surface IS2 may increase toward the upper surface of the second body portion 120 from the upper surface of the first body portion 110. In addition, a distance between the second metal layer 320 disposed on the third inner surface IS3 and the second metal layer 320 disposed on the fourth inner surface IS4 may increase toward the upper surface of the second body portion 120 from the upper surface of the first body portion 110. Alternatively, when the first to fourth inner surfaces IS1, IS2, IS3, and IS4 are perpendicular to the upper surface of the first body portion 110, the distance between the second metal layers 320 disposed on the first to fourth inner surfaces IS1, IS2, IS3, and IS4 may be constant. For example, the distance between the second metal layers 320 disposed on the inner surfaces facing each other may be constant.

The first and second metal layers 310 and 320 may be spaced apart from each other. For example, the first and second metal layers 310 and 320 may be spaced apart in the first direction (x-axis) and the second direction (y-axis). The first and second metal layers 310 and 320 may have a first distance d1 defined as a distance in the first direction and a second distance d2 defined as a distance in the second direction. The first and second distances d1 and d2 may correspond to each other. The first and second distances d1 and d2 may be constant. That is, the first and second metal layers 310 and 320 may be disposed to be spaced apart at a constant distance.

The first distance d1 and the second distance d2 may be about 10 μm to about 180 μm. In detail, the first distance d1 and the second distance d2 may be about 15 μm to about 170 μm. Preferably, the first distance d1 and the second distance d2 may be about 20 μm to about 150 μm. When the first and second distances d1 and d2 are less than about 10 μm, a separation distance between the first and second metal layers 310 and 320 is insufficient, so that an electric short may occur. In addition, the separation distance may not be sufficient in a process of forming an exposed region by separating the first and second metal layers, and thus a process failure may occur. In addition, when the first and second distances d1 and d2 exceed about 180 μm, it may be difficult to secure a region in which the light-emitting device 500 is disposed. Therefore, it is preferable that the first and second distances d1 and d2 satisfy the above-described range.

The through portion 150 may be disposed between the first and second metal layers 310 and 320. For example, the first and second metal layers 310 and 320 may be spaced apart from each other to form the through portion 150 between the first and second metal layers 310 and 320. In detail, a metal layer may be formed on the body 100, and the metal layer may provide the cavity 170. In detail, the metal layer may be formed to have a thin thickness on the body 100 so that the second body portion 120 and the metal layer may provide the cavity 170. After the metal layer is formed, it is possible to pattern the metal layer by physical and/or chemical methods. For example, the patterning may be performed using a laser or an etching solution. The metal layer may include the first and second metal layers 310 and 320 spaced apart from each other by the patterning, and the through portion 150 may be positioned between the first and second metal layers 310 and 320. The through portion 150 may expose the upper surface of the body 100.

The through portion 150 may be formed on the first body portion 110. The through portion 150 may be formed on the separation portion of the body 100. The through portion 150 may be disposed on a region vertically overlapped with the separation portion of the body 100. Accordingly, the through portion 150 may expose the separation portion. The first metal layer 310 may be formed on the upper surface of the first frame 210, and the second metal layer 320 may be disposed surrounding the first metal layer 310 on the upper surface of the first body portion 110 and the first to fourth inner surfaces IS1, IS2, IS3, and IS4. Accordingly, the through portion 150 may be positioned on the first body portion 110, and may be spaced apart from the first to fourth inner surfaces IS1, IS2, IS3, and IS4. That is, the through portion 150 may be spaced apart from the second body portion 120.

The through portion 150 may be disposed on the body 100 to surround the first metal layer 310. For example, the through portion 150 may have a predetermined width as shown in FIG. 2, and may be disposed surrounding the first metal layer 310. The through portion 150 may have a predetermined width, and may be disposed on the entire region of a circumference of the first metal layer 310.

A width of the through portion 150 may correspond to a distance between the first and second metal layers 310 and 320. In detail, the width of the through portion 150 may correspond to the distance d1 in the first direction of the first and second metal layers 310 and 320. In addition, the width of the through portion 150 may correspond to the distance d2 of the second direction of the first and second metal layers 310 and 320. The through portion 150 may have a predetermined width. The width of the through portion 150 may be about 10 µm to about 180 µm. In detail, the width of the through portion 150 may be about 15 µm to about 170 µm. Preferably, the width of the through portion 150 may be about 20 µm to about 150 µm.

A height of the through portion 150 may correspond to the thicknesses of the first and second metal layers 310 and 320. For example, the height of the through portion 150 may be about 0.8 µm to about 1.2 µm. In detail, the height of the through portion 150 may be about 0.9 µm to about 1.1 µm. In more detail, the height of the through portion 150 may be about 0.95 µm to about 1.05 µm.

The light-emitting element package 1000 may include the light-emitting device 500. The light-emitting device 500 may be disposed on the body 100. The light-emitting device 500 may be disposed on the first body portion 110. The light-emitting device 500 may be disposed in the cavity 170. The light-emitting device 500 may be an ultraviolet light-emitting device that emits ultraviolet rays.

The light-emitting device 500 may include a light-emitting structure 510, a first electrode 710, and a second electrode 730. The first electrode 710 may be disposed on an upper surface of the light-emitting structure 510, and the second electrode 730 may be disposed on a bottom surface of the light-emitting structure 510.

The light-emitting structure 510 may include a compound semiconductor. For example, the light-emitting structure 510 may be provided as, for example, a Group II-VI or Group III-V compound semiconductor.

The light-emitting structure 510 may include a first conductive type semiconductor layer 511, an active layer 513, and a second conductive type semiconductor layer 515. The first conductive type semiconductor layer 511 and the second conductive type semiconductor layer 515 may be implemented as at least one of the Group II-VI or Group III-V compound semiconductors. In addition, the active layer 513 may be implemented as a compound semiconductor. The active layer 513 may be implemented as, for example, at least one of the Group III-V or Group II-VI compound semiconductors.

The light-emitting device 500 may include one or a plurality of light-emitting cells therein. The light-emitting cell may include at least one of an n-p junction, a p-n junction, an n-p-n junction, and a p-n-p junction. The plurality of light-emitting cells may be connected in series with each other in one light-emitting device. Accordingly, the light-emitting device 500 may have one or the plurality of light-emitting cells, and when n light-emitting cells are disposed in one light-emitting device, it may be driven by n times a driving voltage. For example, when the driving voltage of one light-emitting cell is 3V and two light-emitting cells are disposed in one light-emitting device, each light-emitting device may be driven by a driving voltage of 6V. Alternatively, when the driving voltage of one light-emitting cell is 3V and three light-emitting cells are disposed in one light-emitting device, each light-emitting device may be driven by a driving voltage of 9V. The number of light-emitting cells disposed in the light-emitting device 500 may be one or two to five. The light-emitting device 500 will be described in more detail with reference to FIG. 24 which will be described later.

The first electrode 710 may be disposed on the upper surface of the light-emitting structure 510, and the second electrode 730 may be disposed on the bottom surface of the light-emitting structure 510. The first electrode 710 may be electrically connected to the first conductive type semiconductor layer 511. In addition, the second electrode 730 may be electrically connected to the second conductive type semiconductor layer 515.

The light-emitting device 500 may be disposed on the first frame 210. The light-emitting device 500 may be disposed on the first metal layer 310. The light-emitting device 500 may be disposed so as to be vertically overlapped with the first metal layer 310. For example, the second electrode 730 of the light-emitting device 500 may be disposed so as to be vertically overlapped with the first metal layer 310. The second electrode 730 may be electrically connected to the first metal layer 310. In addition, the light-emitting device 500 may further include a wire 600. The wire 600 may be disposed on the first electrode 710. The wire 600 may be disposed between the first electrode 710 of the light-emitting device 500 and the second metal layer 320. The first electrode 710 may be electrically connected to the second metal layer 320 by the wire 600.

The body 100 of the light-emitting element package 1000 according to the embodiment may omit an expensive material such as ceramic, and may include a resin material. Accordingly, a manufacturing cost of the light-emitting element package 1000 may be reduced and process efficiency may be improved. In addition, it is possible to minimize that light emitted from the light-emitting device 500 is incident on the body 100 by disposing the metal layers 310 and 320 on the body 100. Accordingly, it is possible to prevent the body 100 from being deformed by the light emitted from the light-emitting device 500. In addition, as the first metal layer 310 is disposed on the body 100 and the light-emitting device 500 is disposed on the first metal layer 310, heat emitted from the light-emitting device 500 may be discharged effectively, and light extraction efficiency may be improved. In addition, the through portion 150 may be disposed between the first and second metal layers 310 and 320 so as to prevent occurrence of an electric short between the first and second frames 210 and 220, and between the first and second metal layers 310 and 320. Accordingly, the light-emitting element package 1000 according to the embodiment may improve optical characteristics, heat dissipation characteristics, and electrical characteristics, and may improve reliability of the package.

In addition, the light-emitting element package 1000 according to the embodiment may include a protection element 650.

Figure 5:
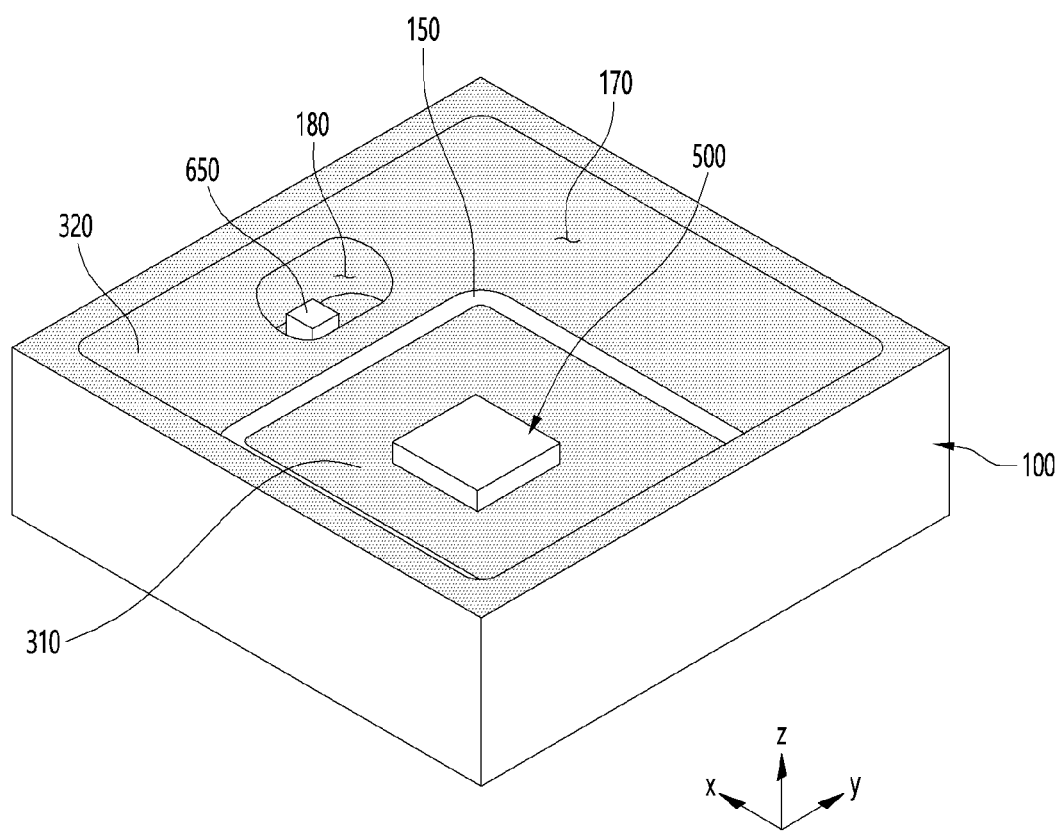
FIG. 5 is a perspective view of a light-emitting element package in which a protection element is disposed.

For example, referring to FIG. 5, the body 100 may include a second cavity 180 exposing a part of the second frame 220. The second cavity 180 may be formed on at least one of the plurality of inner surfaces IS1, IS2, IS3, and IS4 of the body 100. For example, the second cavity 180 may be positioned on the first inner surface IS1 of the first cavity 170. In this case, the inclination angle of the first inner surface IS1 with respect to the upper surface of the body 100 may be different from the inclination angle of the second inner surface IS2 facing the first inner surface IS1. For example, the inclination angle of the first inner surface IS1 may be smaller than the inclination angle of the second inner surface IS2. In this case, the second cavity 180 may not be overlapped with the first frame 210. In detail, a bottom surface of the second cavity 180 may not be vertically overlapped with the first frame 210. In addition, the first cavity 170 may not be overlapped with the second frame 220. In detail, the bottom surface of the first cavity 170 may not be vertically overlapped with the second frame 220.

The second cavity 180 may pass through the first inner surface IS1 to expose a part of the upper surface of the second frame 220. The area of the second frame 220 exposed to the bottom surface of the second cavity 180 may be about 10% or less of the entire area of the body 100. In detail, the exposed area of the second frame 220 may be about 3% to about 10% of the entire area of the body 100. When the area is less than about 3%, a problem in a process may be caused due to a space limitation for mounting the protection element 650. In addition, when the area exceeds about 10%, reflectance may be lowered by the second cavity 180, and thus light extraction efficiency may be lowered.

The second metal layer 320 may be disposed in the second cavity 180. In detail, the second metal layer 320 may be disposed on an inner surface of the second cavity 180. Here, the inner surface of the second cavity 180 may refer to an inner surface of the body 100 exposed by the second cavity 180. In addition, the second metal layer 320 may be disposed on the upper surface of the second frame 220 exposed to the bottom surface of the second cavity 180. The second metal layer 320 may be disposed on the entire region of the second cavity 180.

Accordingly, a part of the upper surface of the second frame 220 exposed by the second cavity 180 may not be exposed. That is, a part of the upper surface of the second frame 220 may be exposed through the second cavity 180 before the second metal layer 320 is disposed, but when the second metal layer 320 is disposed, the upper surface of the second frame 220 in the second cavity 180 may not be exposed.

The protection element 650 may be disposed in the second cavity 180. The protection element 650 may be disposed on the second metal layer 320 disposed inside the second cavity 180. The protection element 650 may be a Zener diode, a thyristor, or a transient voltage suppression (TVS), but the embodiment is not limited thereto. The protection element 650 may be connected to the first metal layer 310 and the second metal layer 320. For example, the protection element 650 may be disposed on the second metal layer 320 in the second cavity 180, and may be connected to the first metal layer 310 by a separate wire separated from the wire 600 of the light-emitting device 500. When the protection element 650 is the Zener diode, the protection element may protect the light-emitting device 500 from electrostatic discharge (ESD).

FIGS. 6 to 10 are views illustrating an example in which a position in which a through portion is formed in the light-emitting element package of FIG. 2 is modified.

Figure 6:
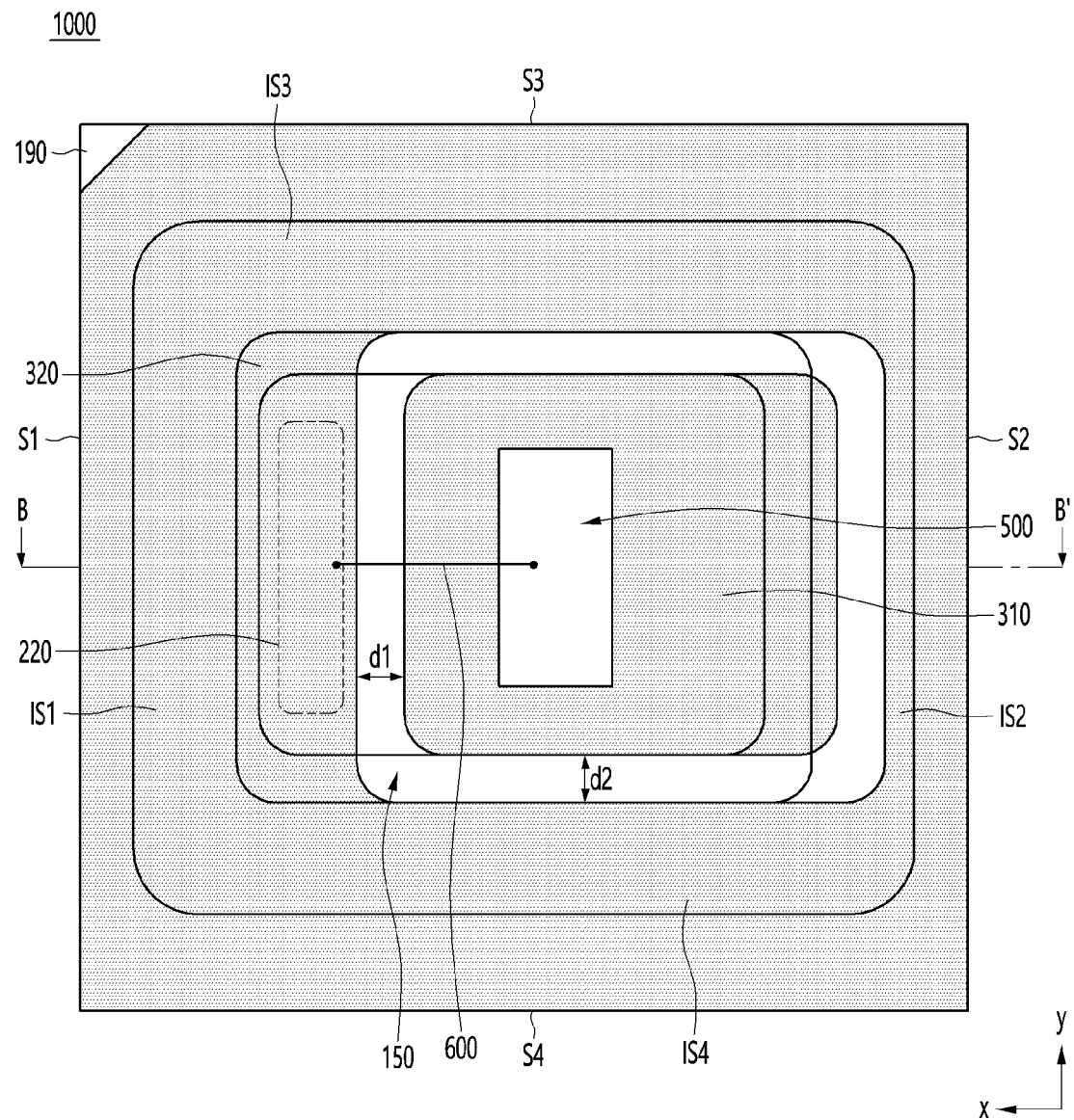
FIGS. 6 to 10 are views illustrating an example in which a position in which a through portion is formed in the light-emitting element package of FIG. 2 is modified.
Figure 7:
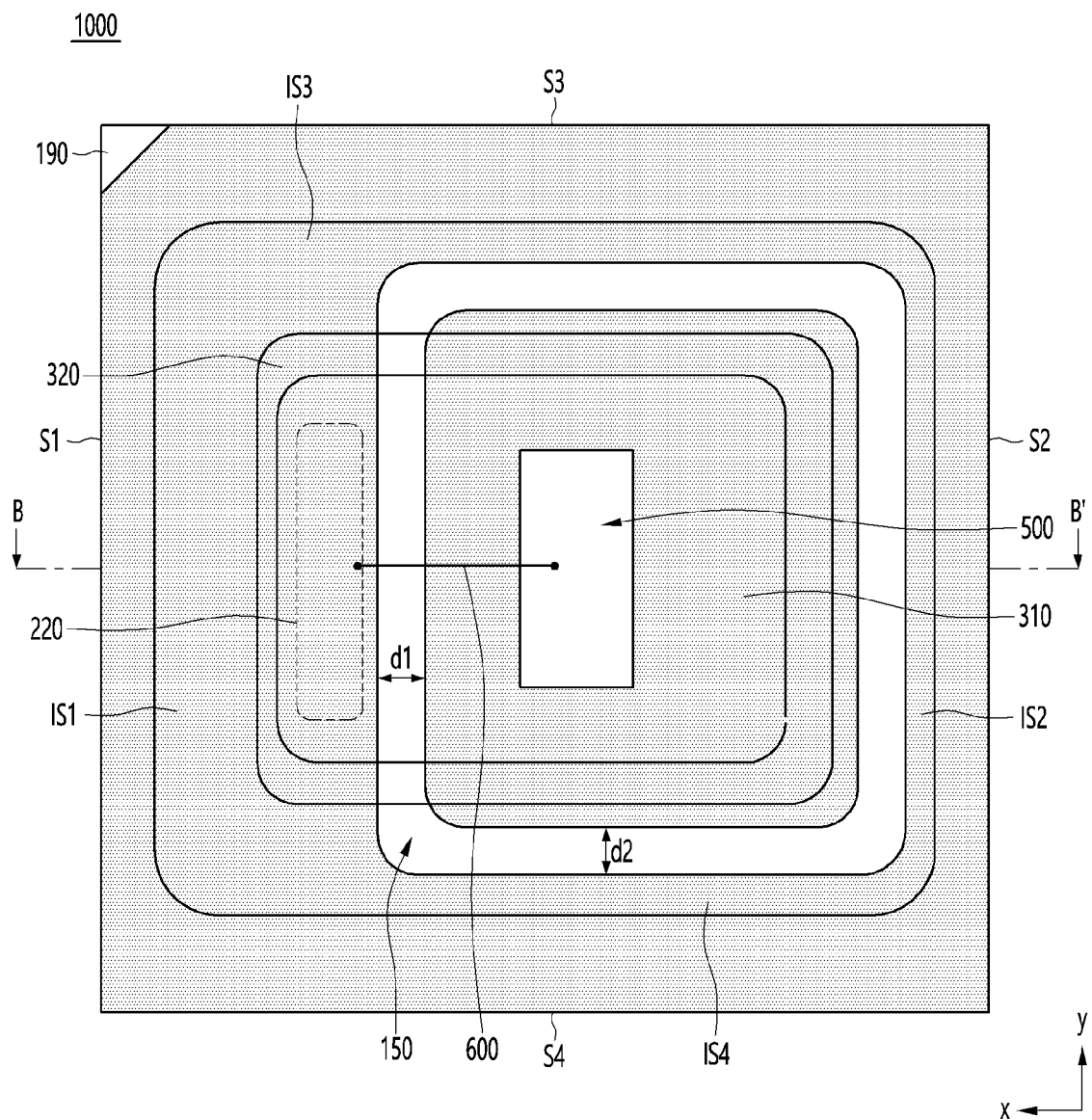
Figure 8:
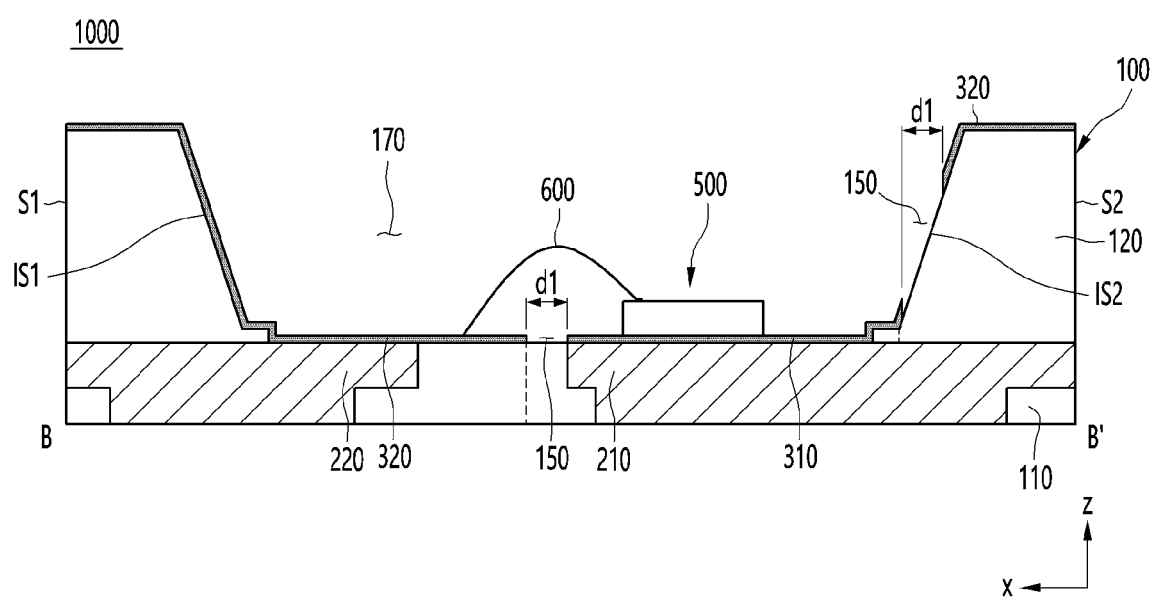

Referring to FIGS. 6 to 8, the first metal layer 310 may be disposed on the first frame 210. The first metal layer 310 may be disposed at a position vertically overlapped with the first frame 210. The first metal layer 310 may be in direct contact with the upper surface of the first frame 210. In addition, the first metal layer 310 may be disposed on the upper surface of the first body portion 110 exposed by the cavity 170. The first metal layer 310 may be disposed on the inner surface of the cavity 170 adjacent to the first metal layer 310. For example, the first metal layer 310 may be disposed on at least one of the second to fourth inner surfaces IS2, IS3, and IS4 excluding the first inner surface IS1. As an example, referring to FIG. 5, the first metal layer 310 may be disposed on the second inner surface IS2, and may be disposed to be spaced apart from the first inner surface IS1, the third inner surface IS3, and the fourth inner surface IS4. As another example, referring to FIG. 6, the first metal layer 310 may be disposed on the second to fourth inner surfaces IS2, IS3, and IS4, and may be disposed to be spaced apart from the first inner surface IS1.

The first metal layer 310 may have lengths in a first direction and a second direction. The length of the first metal layer 310 in the first direction may be the same as or different from the length in the second direction. Further, the length of at least one of the first and second directions of the first metal layer 310 may be longer than that of at least one of the first and second directions of the first frame 210. Accordingly, an area of the first metal layer 310 may be larger than that of the upper surface of the first frame 210 in the cavity 170. In addition, the first metal layer 310 may be disposed to cover the entire upper surface of the first frame 210 exposed by the cavity 170 and a part of the upper surface of the first body portion 110, and may be disposed on at least one of the second to fourth inner surfaces IS2, IS3, and IS4.

The second metal layer 320 may be disposed to be spaced apart from the first metal layer 310. The second metal layer 320 may be disposed on the second frame 220. The second metal layer 320 may be disposed at a position vertically overlapped with the second frame 220. The second metal layer 320 may be in direct contact with the upper surface of the second frame 220. The second metal layer 320 may be disposed on the upper surface of the body 100 exposed by the cavity 170. For example, the second metal layer 320 may be disposed on the upper surface of the first body portion 110 exposed by the cavity 170. The second metal layer 320 may be disposed on the separation portion of the body portion 110. The second metal layer 320 may be disposed on the upper surface of the first body portion 110 not overlapped with the first metal layer 310. In addition, the second metal layer 320 may be disposed on the first to fourth inner surfaces IS1, IS2, IS3, and IS4 formed by the cavity 170. The second metal layer 320 may be disposed at a position vertically overlapped with the first to fourth inner surfaces IS1, IS2, IS3, and IS4. The second metal layer 320 may be in direct contact with the first to fourth inner surfaces IS1, IS2, IS3, and IS4. As an example, referring to FIG. 5, when the first metal layer 310 is disposed on a partial region of the second inner surface IS2, the second metal layer 320 may be disposed on a partial region of the upper surface of the first body portion 110, the entire region of the first inner surface IS1, the entire region of the third inner surface IS3, and the entire region of the fourth inner surface IS4, and may be disposed on a partial region of the second inner surface IS2 in which the first metal layer 310 is not disposed. As another example, referring to FIG. 6, when the first metal layer 310 is disposed on a partial region of the second to fourth inner surfaces IS2, IS3, and IS4, the second metal layer 320 may be disposed on a partial region of the upper surface of the body 110, the entire region of the first inner surface IS1, and a partial region of each of the second to fourth inner surfaces IS2, IS3, and IS4. In detail, the second metal layer 320 disposed on the second to fourth inner surfaces IS2, IS3, and IS4 may be disposed on a region not overlapped with the first metal layer 310. Accordingly, an area of the second metal layer 320 disposed on the first inner surface IS1 may be larger than that of the second metal layer 320 disposed on the second inner surface IS2. Further, the area of the second metal layer 320 disposed on the first inner surface IS1 may be larger than that of the second metal layer 320 disposed on the third and fourth inner surfaces IS3 and IS4.

In addition, the second metal layer 320 may be disposed on the upper surface of the body 100, for example, the upper surface of the second body portion 120. The second metal layer 320 may be disposed at a position vertically overlapped with the upper surface of the second body portion 120. The second metal layer 320 may be in direct contact with the upper surface of the second body portion 120. The second metal layer 320 may be disposed on the entire region of the upper surface of the second body portion 120. In addition, the second metal layer 320 may be disposed to be spaced apart from the first frame 210.

That is, the second metal layer 320 may be extended to the upper surface of the first body portion 110, the inner surface of the second body portion 120, and the upper surface of the second body portion 120. The second metal layer 320 may surround the first metal layer 310, and may be disposed to be connected to each other on the upper surface of the second frame 220, a part of the upper surface of the first body portion 110, the first to fourth inner surfaces IS1, IS2, IS3, and IS4, and the upper surface of the second body portion 120.

The first and second metal layers 310 and 320 may be spaced apart from each other. For example, the first and second metal layers 310 and 320 may have a first distance d1 defined as a distance in the first direction and a second distance d2 defined as a distance in the second direction. The first and second distances d1 and d2 may correspond to each other. The first and second distances d1 and d2 may be constant. That is, the first and second metal layers 310 and 320 may be disposed to be spaced apart at a constant distance.

The first distance d1 and the second distance d2 may be about 10 μm to about 180 μm. In detail, the first distance d1 and the second distance d2 may be about 15 μm to about 170 μm. Preferably, the first distance d1 and the second distance d2 may be about 20 μm to about 150 μm. When the first and second distances d1 and d2 are less than about 10 μm, a separation distance between the first and second metal layers 310 and 320 is insufficient, so that an electric short may occur. In addition, the separation distance may not be sufficient in a process of forming an exposed region by separating the first and second metal layers, and thus a process failure may occur. In addition, when the first and second distances d1 and d2 exceed about 180 μm, it may be difficult to secure a region in which the light-emitting device 500 is disposed. Therefore, it is preferable that the first and second distances d1 and d2 satisfy the above-described range.

The above-described through portion 150 may be disposed between the first and second metal layers 310 and 320. The through portion 150 may be disposed on the separation portion of the body 100. The through portion 150 may be disposed on a region vertically overlapped with the separation portion. The through portion 150 may expose the separation portion. The through portion 150 may be formed on the first body portion 110 and the second body portion 120. For example, the first metal layer 310 may be disposed on the upper surface of the first frame 210, the upper surface of the first body portion 110, and at least one of the inner surfaces IS1, IS2, IS3, and IS4, and the through portion 150 may be positioned on the first and second body portions 110 and 120 as the second metal layer 320 is disposed on the first to fourth inner surfaces IS1, IS2, IS3, and IS4. That is, the through portion 150 may be disposed on inclined surfaces of the first body portion 110 and the cavity 170. As an example, referring to FIG. 5, when the first metal layer 310 is spaced apart from the first inner surface IS1, the third inner surface IS3, and the fourth inner surface IS4 to be disposed on a partial region of the second inner surface IS2, the through portion 150 may be positioned on the second inner surface IS2 of the first body portion 110 and the second body portion 120. As another example, referring to FIG. 6, when the first metal layer 310 is disposed on the second to fourth inner surfaces IS2, IS3 and IS4 and is spaced apart from the first inner surface IS1, the through portion 150 may be positioned on the second to fourth inner surfaces IS2, IS3, and IS4 of the first body portion 110 and the second body portion 120.

The through portion 150 may be disposed around the first metal layer 310. The through portion 150 may be disposed surrounding the entire circumference of the first metal layer 310. The through portion 150 may have a predetermined width and may be disposed around the first metal layer 310. The through portion 150 may be disposed surrounding the entire circumference of the first metal layer 310. The through portion 150 may expose the upper surface of the body 100. In detail, the through portion 150 may expose the upper surface of the first body portion 110 and the upper surface of the second body portion 120.

A width of the through portion 150 may correspond to a distance between the first and second metal layers 310 and 320. The width of the through portion 150 may correspond to the distance d1 and the distance d2. The through portion 150 may have a predetermined width. The width of the through portion 150 may be about 10 μm to about 180 μm. In detail, the width of the through portion 150 may be about 15 μm to about 170 μm. Preferably, the width of the through portion 150 may be about 20 μm to about 150 μm.

Figure 9:
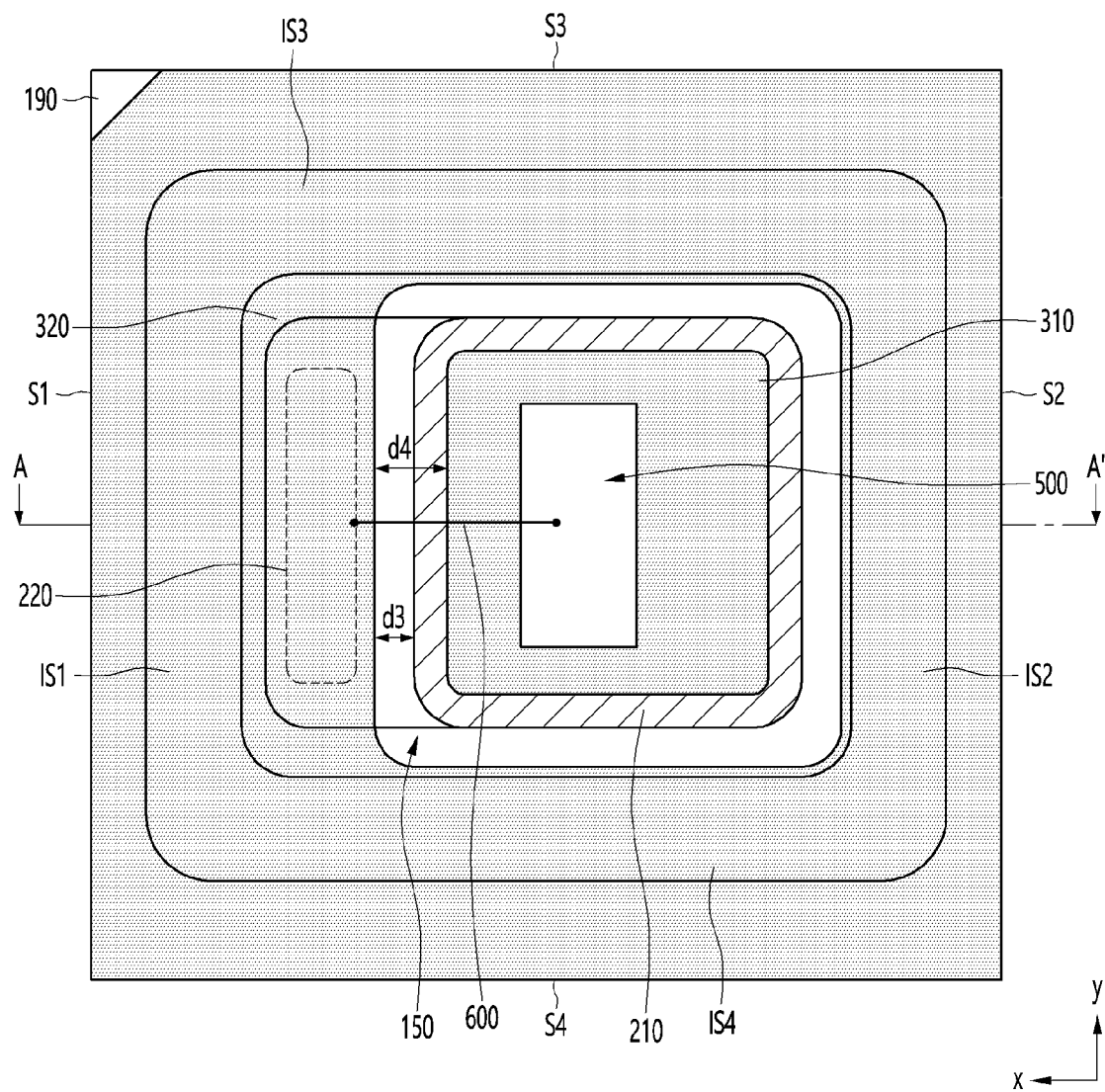
Figure 10:
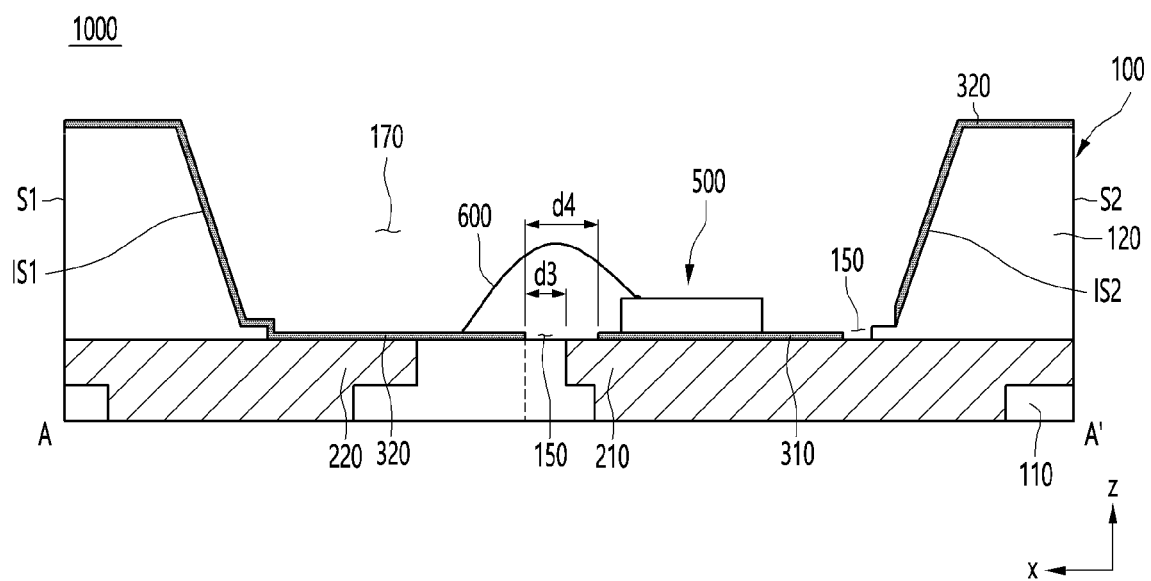

In addition, referring to FIGS. 9 and 10, the first metal layer 310 may be disposed on the first frame 210. The first metal layer 310 may be disposed at a position vertically overlapped with the first frame 210. The first metal layer 310 may be in direct contact with the upper surface of the first frame 210. In addition, the first metal layer 310 may be disposed on the upper surface of the body 100 exposed by the cavity 170. For example, the first metal layer 310 may be disposed on the upper surface of the first body portion 110 exposed by the cavity 170. In addition, the first metal layer 310 may be disposed to be spaced apart from a separation portion of the first body portion 110. The first metal layer 310 may be disposed to be spaced apart from the second frame 220. The first metal layer 310 may be disposed to be spaced apart from the second body portion 120. The first metal layer 310 may be disposed to be spaced apart from the first to fourth inner surfaces IS1, IS2, IS3, and IS4.

Figure 21:
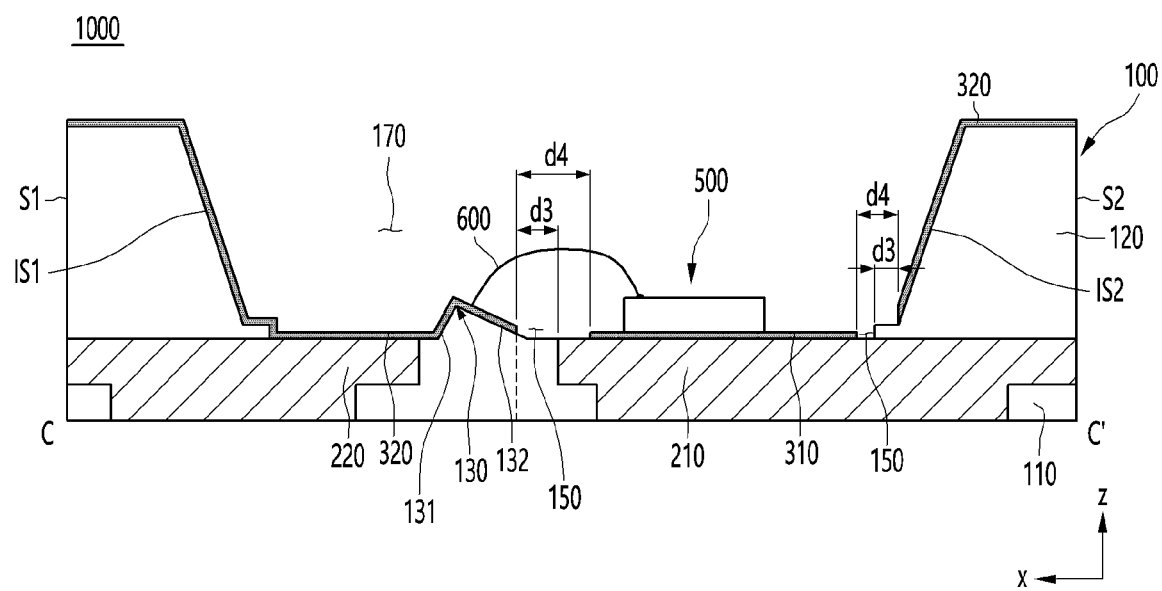

The first metal layer 310 may have lengths in a first direction and a second direction. The length in the first direction of the first metal layer 310 may be the same as or different from the length in the second direction. In addition, the lengths in the first direction and in the second direction of the first metal layer 310 may be different from the lengths in the first and second directions of the first frame 210 exposed by the cavity 170. For example, as shown in FIG. 21, the length in the first direction of the first metal layer 310 may be shorter than the length in the first direction of the first frame 210. In addition, the length in the second direction of the first metal layer 310 may be shorter than the length in the second direction of the first frame 210. In addition, although not shown in the drawing, the length in the first direction of the first metal layer 310 may be shorter than the length in the first direction of the first frame 210, and the length in the second direction of the first metal layer 310 may correspond to the length in the second direction of the first frame 210. Alternatively, the length in the first direction of the first metal layer 310 may correspond to the length in the first direction of the first frame 210, and the length in the second direction of the first metal layer 310 may be shorter than the length in the second direction of the first frame 210. Accordingly, the area of the first metal layer 310 may be smaller than that of the upper surface of the first frame 210 in the cavity 170. In addition, a part of the upper surface of the first frame 210 may be exposed in the cavity 170.

The second metal layer 320 may be disposed to be spaced apart from the first metal layer 310. The second metal layer 320 may be disposed to be spaced apart from the first frame 210. The second metal layer 320 may be disposed on the second frame 220. The second metal layer 320 may be in direct contact with the upper surface of the second frame 220. In addition, the second metal layer 320 may be disposed on the upper surface of the body 100 exposed by the cavity 170. For example, the second metal layer 320 may be disposed on the upper surface of the first body portion 110 exposed by the cavity 170. The second metal layer 320 may be disposed on the separation portion of the first body portion 110.

In addition, the second metal layer 320 may be disposed on the first to fourth inner surfaces IS1, IS2, IS3, and IS4 formed by the cavity 170. In detail, the second metal layer 320 may be disposed at a position vertically overlapped with the first to fourth inner surfaces IS1, IS2, IS3, and IS4. The second metal layer 320 may be in direct contact with the first to fourth inner surfaces IS1, IS2, IS3, and IS4. The second metal layer 320 may be disposed on the entire region of the first to fourth inner surfaces IS1, IS2, IS3, and IS4.

In addition, the second metal layer 320 may be disposed on an upper surface of the body 100, for example, the upper surface of the second body portion 120. The second metal layer 320 may be disposed at a position vertically overlapped with the upper surface of the second body portion 120. The second metal layer 320 may be in direct contact with the upper surface of the second body portion 120. The second metal layer 320 may be disposed on the entire region of the upper surface of the second body portion 120. In addition, the second metal layer 320 may be disposed to be spaced apart from the first frame 210.

The second metal layer 320 may be disposed to be connected to each other on the upper surface of the second frame 220, a part of the upper surface of the first body portion 110, the first to fourth inner surfaces IS1, IS2, IS3, and IS4, and the upper surface of the second body portion 120.

The second metal layer 320 may be spaced apart from the first metal layer 310. In addition, the second metal layer 320 may be spaced apart from the first frame 210 exposed to the lower surface of the cavity 170. The second metal layer 320 may have a third distance d3 as a distance in the first direction between the exposed first frame 210 and the second metal layer 320. The third distance d3 may be about 10 µm to about 180 µm. In detail, the third distance d3 may be about 15 µm to about 170 µm. Preferably, the third distance d3 may be about 20 µm to about 150 µm. When the third distance d3 is less than about 10 µm, a separation distance between the second metal layer 320 and the first frame 210 is insufficient, and an electric short may occur. In addition, when the third distance d3 exceeds about 180 µm, it may be difficult to secure a region in which the light-emitting device 500 is disposed. Therefore, it is preferable that the third distance d3 satisfies the above-described range. In addition, although not shown in the drawing, the second metal layer 320 may have a fifth distance (not shown) defined as a distance in the second direction between the exposed first frame 210 and the second metal layer 320. In this case, the fifth distance may correspond to the third distance. That is, the second metal layer 320 may be spaced apart from the first frame 210 at a constant distance.

In addition, the second metal layer 320 may have a fourth distance d4 defined as a distance in the first direction between the first metal layer 310 and the second metal layer 320. The fourth distance d4 may be larger than the third distance d3. Accordingly, a part of the upper surface of the first frame 210 may be exposed. The fourth distance d4 may be about 1.1 to 2 times the third distance d3. In detail, the fourth distance d4 may be about 1.1 to 1.6 times the third distance d3. When the fourth distance d4 does not satisfy the above-described range, the area of the upper surface of the first frame 210 exposed to the lower surface of the cavity 170 may be increased, and thus an amount of light incident on the body 100 may be increased. Therefore, it may be preferable that the fourth distance d4 satisfies the above-described range. In addition, although not shown in the drawing, the second metal layer 320 may have a sixth distance (not shown) defined as a distance in the second direction between the second frame 220 and the second metal layer 320. In this case, the sixth distance may correspond to the fourth distance. That is, the second metal layer 320 may be spaced apart from the first metal layer 310 at a constant distance.

The above-described through portion 150 may be disposed between the first and second metal layers 310 and 320. The through portion 150 may be disposed on the first body portion 110 and the first frame 210. For example, the through portion 150 may be disposed on the separation portion of the body 100. In addition, the through portion 150 may be disposed on the first frame 210 exposed by the first metal layer 310. In addition, the through portion 150 may be spaced apart from the second body portion 120. For example, the through portion 150 may be spaced apart from the first to fourth inner surfaces IS1, IS2, IS3, and IS4. The through portion 150 may expose the upper surface of the body 100 and the upper surface of the first frame 210.

The through portion 150 may be positioned around the first metal layer 310. In detail, the through portion 150 may be disposed surrounding the entire circumference of the first metal layer 310. The through portion 150 may be disposed around the first metal layer 310 and the first frame 210 exposed by the first metal layer 310. The through portion 150 may have a predetermined width and may be disposed around the first metal layer 310 and the first frame 210. The through portion 150 may have a predetermined width, and may be disposed on the entire region of a circumference of the first metal layer 310 and the first frame 210.

A width of the through portion 150 may correspond to a distance between the first and second metal layers 310 and 320. The width of the through portion 150 may correspond to the distance d1 and the distance d2. The through portion 150 may have a predetermined width. The width of the through portion 150 may be about 10 μm to about 180 μm. In detail, the width of the through portion 150 may be about 15 μm to about 170 μm. Preferably, the width of the through portion 150 may be about 20 μm to about 150 μm.

Figure 11:
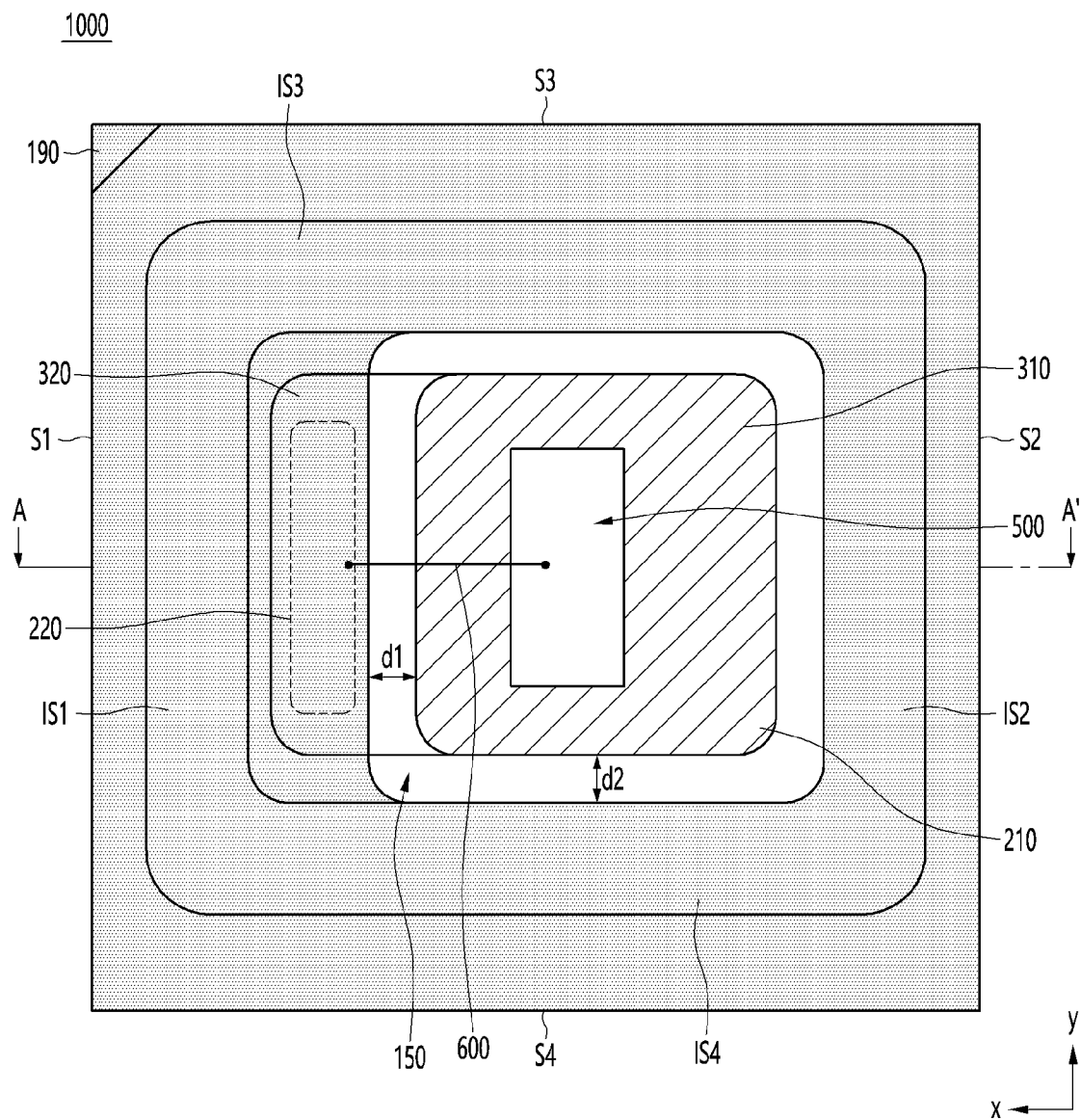
FIGS. 11 and 12 are views illustrating an example in which a first metal layer in the light-emitting element package of FIG. 2 is omitted.
Figure 12:
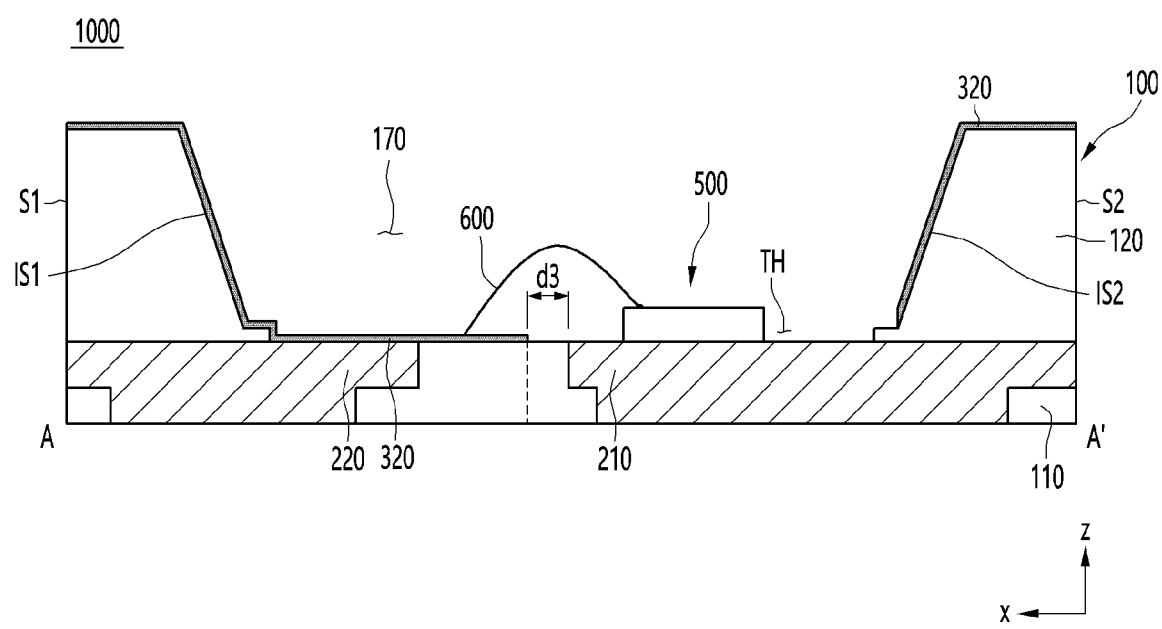

FIGS. 11 and 12 are views illustrating an example in which a first metal layer of the light-emitting element package of FIG. 2 is omitted.

Referring to FIGS. 11 and 12, the body 100 may support the first frame 210 and the second frame 220. The body 100 may include a separation portion disposed between the first and second frames. The first and second frames 210 and 220 may be physically spaced apart by the separation portion.

The second metal layer 320 may be disposed on the second frame 220. The second metal layer 320 may be disposed to be spaced apart from the first frame 210. The second metal layer 320 may be disposed around the first frame 210. The second metal layer 320 may be disposed surrounding the entire circumference of the first frame 210. The second metal layer 320 may be in direct contact with the upper surface of the second frame 220. The second metal layer 320 may be disposed on the upper surface of the body 100 exposed by the cavity 170. For example, the second metal layer 320 may be disposed on the upper surface of the first body portion 110, the inner surfaces IS1, IS2, IS3, and IS4 of the second body portion 220, and the upper surface of the second body portion 120. As the second metal layer 320 is formed to have a thin thickness on the body 100, the second metal layer 320 may have the cavity 170.

The second metal layer 320 may have a first distance d1 defined as a distance in a first direction from the first frame 210, and may have a second distance d2 defined as a distance in a second direction. The first and second distances d1 and d2 may correspond to each other. The first distance d1 and the second distance d2 may be about 10 μm to about 180 μm. In detail, the first distance d1 and the second distance d2 may be about 15 μm to about 170 μm. Preferably, the first distance d1 and the second distance d2 may be about 20 μm to about 150 μm.

The second metal layer 320 may include the through portion 150. The through portion 150 may be disposed on the body 100. The through portion 150 may be disposed in the cavity 170. For example, the through portion 150 may be disposed on the bottom surface of the cavity 170, and may be disposed on the separation portion and the first frame 210. The through portion 150 may expose the separation portion and the first frame 210. The through portion 150 may expose the entire upper surface of the first frame 210.

The light-emitting device 500 may be disposed in the cavity 170. For example, the light-emitting device 500 may be disposed in the through portion 150. In detail, the light-emitting device 500 may be disposed on the first frame 210 exposed by the through portion 150. The light-emitting device 500 may be in direct contact with and connected to the first frame 210. For example, the light-emitting device 500 may be directly connected to the first frame 210 by a conductive portion or the like without the first metal layer 310 described above. In addition, the light-emitting device 500 may be electrically connected to the second metal layer 320 by the wire 600 or the like.

Figure 13:
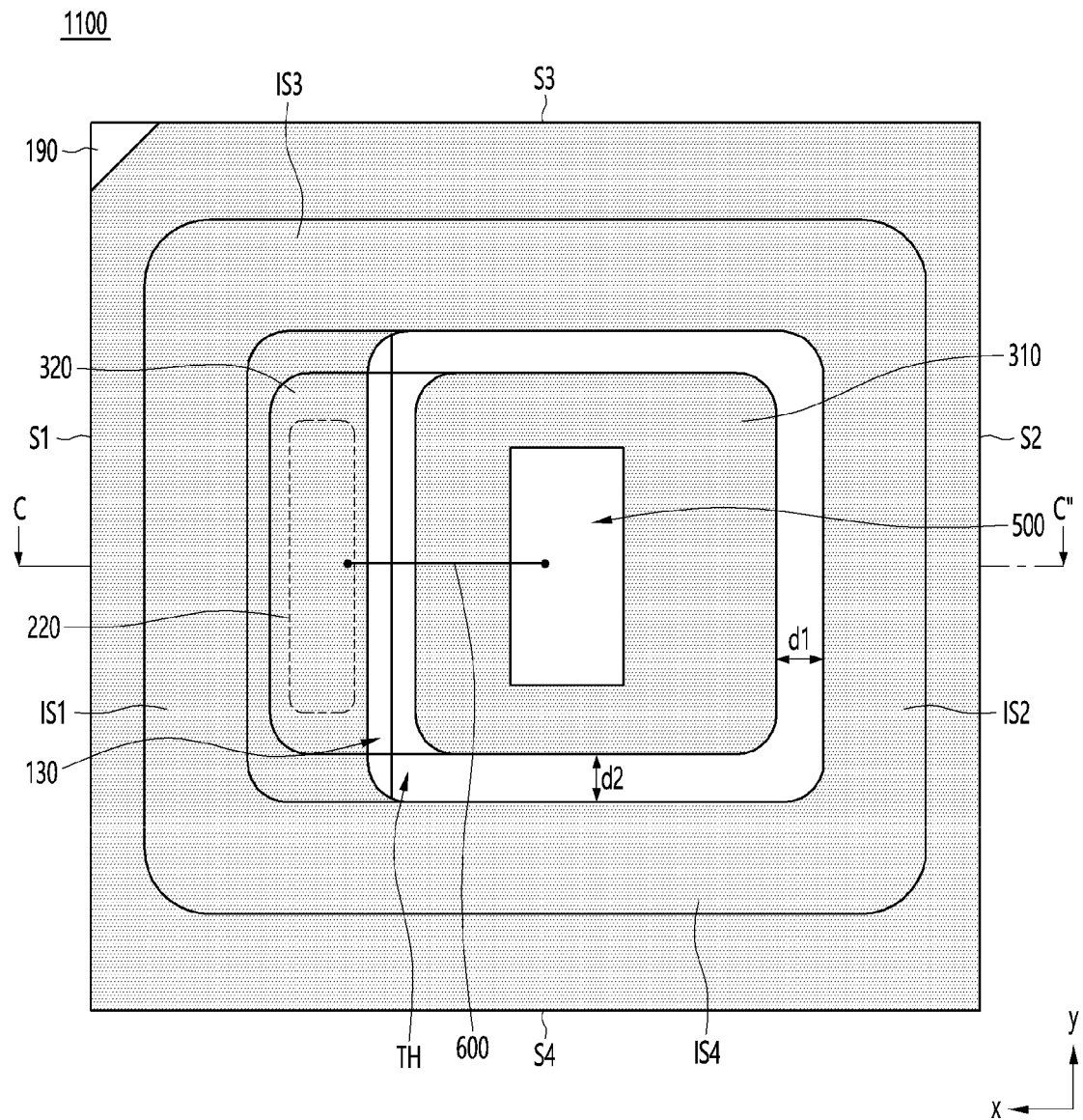
FIG. 13 is a plan view of a structure in which the light-emitting element package of FIG. 2 further includes a protrusion.
Figure 14:
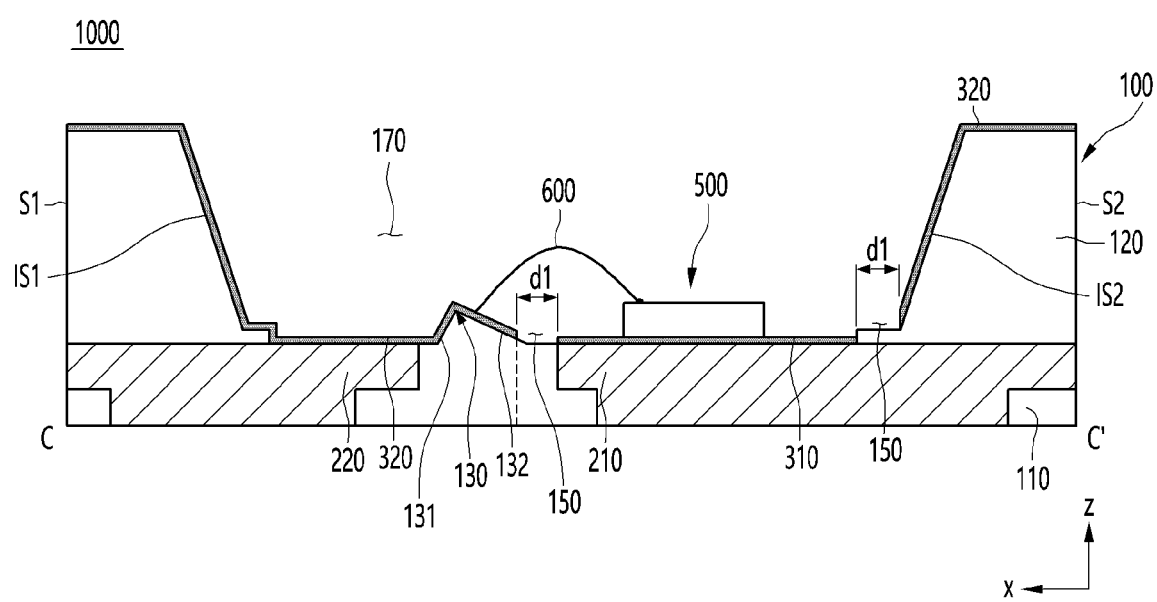
FIG. 14 is a cross-sectional view taken along line C-C' of the light-emitting element package of FIG. 13.

FIG. 13 is a plan view of a structure in which the light-emitting element package of FIG. 2 further includes a protrusion, and FIG. 14 is a cross-sectional view taken along line C-C' of the light-emitting element package of FIG. 13. In addition, FIGS. 15 to 21 are views illustrating an example in which a position in which a through portion is formed in the light-emitting element package of FIG. 13 is modified. In the description using FIGS. 13 to 21, description of a configuration the same as or similar to that of the light-emitting element package described above will be omitted, and the same drawing reference numerals will be designated to the same or similar configurations.

Referring to FIGS. 13 to 21, the body 100 may support the first and second frames 210 and 220, and the body 100 may include a separation portion disposed between the first and second frames 210 and 220.

A partition wall portion 130 may be further disposed on the body 100. The partition wall portion 130 may be disposed on the separation portion. The partition wall portion 130 may be disposed on the body 100 exposed to the lower surface of the cavity 170. The partition wall portion 130 may be disposed on the first body portion 110. The partition wall portion 130 may have a shape protruding upward from the upper surface of the first body portion 110. The partition wall portion 130 may be integrally formed with the body 100.

The partition wall portion 130 may be disposed between the first and second frames 210 and 220. The partition wall portion 130 may be disposed between the upper surfaces of the first and second frames 210 and 220 exposed by the cavity 170.

The partition wall portion 130 may have lengths in a first direction and a second direction. The length of the partition wall portion 130 in the first direction may be shorter than the length in the second direction. The length of the partition wall portion 130 in the first direction may be shorter than a distance between the upper surfaces of the first and second frames 210 and 220 exposed to the lower surface of the cavity 170.

The partition wall portion 130 may extend in the second direction in the cavity 170. The length in the second direction of the partition wall portion 130 may be the same as or different from the length in the second direction of the first body portion 110 disposed on the lower surface of the cavity 170. For example, the length in the second direction of the partition wall portion 130 may be longer than the length of the upper surface of the first body portion 110 exposed to the lower surface of the cavity 170. Accordingly, the partition wall portion 130 may be in contact with the third inner surface IS3 and the fourth inner surface IS4 facing each other in the second direction. Accordingly, it is possible to improve reliability of the body 100. In detail, as the partition wall portion 130 is connected to the upper surface of the first body portion 110 and the inner surface of the second body portion 120, it is possible to effectively disperse stress due to external shock and thermal expansion, thereby improving the reliability. Alternatively, the length in the second direction of the partition wall portion 130 may be shorter than the length in the second direction of the first body portion 110. In detail, the length in the second direction of the partition wall portion 130 may be longer than the length in the second direction of each of the first and second frames 210 and 220, and may be shorter than the length in the second direction of the first body portion 110 exposed by the cavity 170.

Accordingly, the partition wall portion 130 may be disposed to be spaced apart from the first to fourth inner surfaces IS1, IS2, IS3, and IS4.

The partition wall portion 130 may include a plurality of surfaces. For example, the partition wall portion 130 may include a first surface 131 facing the first inner surface IS1 and a second surface 132 facing the second inner surface IS2. The first surface 131 may be a surface adjacent to the second frame 220, and the second surface 132 may be a surface adjacent to the first frame 210 and facing the light-emitting device 500. The first surface 131 and the second surface 132 of the partition wall portion 130 may be inclined with respect to the upper surface of the first body portion 110. For example, the first surface 131 may have a first inclination angle with respect to the upper surface of the first body portion 110, and the second surface may have a second inclination angle with respect to the upper surface of the second body portion 120. The first and second inclination angles may be alternate angles. The first inclination angle of the first surface 131 may be different from the second inclination angle of the second surface 132. For example, the first inclination angle may be smaller than the second inclination angle.

The first surface 131 and the second surface 132 may include at least one of a flat surface and a curved surface. As an example, the first surface 131 may be a curved surface, and the second surface 132 may be a flat surface. As another example, the first surface 131 may include both a flat surface and a curved surface, and the second surface 132 may be a flat surface.

The partition wall portion 130 may have a width. The width may be the length in the first direction of the partition wall portion 130. The width of the partition wall portion 130 may decrease toward an upper portion thereof. In detail, a distance between the first surface 131 and the second surface 132 may decrease as a distance from the upper surface of the first body portion 110 increases.

The width of the partition wall portion 130 may be about 320 μm to about 360 μm. In detail, the width of the partition wall portion 130 may be about 330 μm to about 350 μm. Here, the above-described range may refer to a maximum width of the partition wall portion 130. In addition, a height in a vertical direction of the partition wall portion 130 may be lower than that of the cavity 170. In the cavity 170, the uppermost portion of the partition wall portion 130 may be positioned above the uppermost surface of the light-emitting device 500. The height of the partition wall portion 130 in the vertical direction (third direction) may be about 100 μm to about 130 μm. In detail, the height of the partition wall portion 130 may be about 100 μm to about 120 μm. Here, the height of the partition wall portion 130 may refer to a height from the upper surface of the first body portion 110 to the uppermost portion of the partition wall portion 130. In addition, the height of the partition wall portion 130 may be higher than a thickness in the vertical direction of the light-emitting device 500. Accordingly, it is possible to prevent an open failure of the wire 600 disposed between the light-emitting device 500 and the second metal layer 320.

The first and second metal layers 310 and 320 may be disposed on the first and second frames 210 and 220, respectively. The first and second metal layers 310 and 320 may be disposed to be spaced apart from each other.

Referring to FIG. 13, the first metal layer 310 may be disposed on the first frame 210. The first metal layer 310 may be disposed at a position vertically overlapped with the first frame 210. The first metal layer 310 may be in direct contact with the upper surface of the first frame 210. In addition, the first metal layer 310 may be disposed on the upper surface of the body 100 exposed by the cavity 170. For example, the first metal layer 310 may be disposed on the upper surface of the first body portion 110 exposed by the cavity 170.

The first metal layer 310 may be disposed to be spaced apart from the second frame 220. The first metal layer 310 may be disposed to be spaced apart from the second metal layer 320. In addition, the first metal layer 310 may be disposed to be spaced apart from the first to fourth inner surfaces IS1, IS2, IS3, and IS4, and may be disposed to be spaced apart from the partition wall portion 130.

Lengths in the first and second directions of the first metal layer 310 may correspond to lengths in the first and second directions of the first frame 210, respectively. Accordingly, an area of the first metal layer 310 may correspond to an area of the first frame 210 of the lower surface of the cavity 170. The first metal layer 310 may be disposed to cover the entire upper surface of the first frame 210 exposed to the lower surface of the cavity 170.

The second metal layer 320 may be disposed to be spaced apart from the first metal layer 310. The second metal layer 320 may be disposed on the second frame 220. The second metal layer 320 may be disposed at a position vertically overlapped with the second frame 220. The second metal layer 320 may be in direct contact with the upper surface of the second frame 220. The second metal layer 320 may be disposed on the upper surface of the body 100 exposed by the cavity 170. For example, the second metal layer 320 may be disposed on the upper surface of the first body portion 110 exposed by the cavity 170. The second metal layer 320 may be disposed on the separation portion of the first body portion 110. In addition, the second metal layer 320 may be disposed on the first to fourth inner surfaces IS1, IS2, IS3, and IS4 formed by the cavity 170. In detail, the second metal layer 320 may be disposed at a position vertically overlapped with the first to fourth inner surfaces IS1, IS2, IS3, and IS4. The second metal layer 320 may be in direct contact with the first to fourth inner surfaces IS1, IS2, IS3, and IS4. The second metal layer 320 may be disposed on the entire region of the first to fourth inner surfaces IS1, IS2, IS3, and IS4.

In addition, the second metal layer 320 may be disposed on the upper surface of the body 100, for example, the upper surface of the second body portion 120. The second metal layer 320 may be disposed at a position vertically overlapped with the upper surface of the second body portion 120. The second metal layer 320 may be in direct contact with the upper surface of the second body portion 120. The second metal layer 320 may be disposed on the entire region of the upper surface of the second body portion 120. In addition, the second metal layer 320 may be disposed to be spaced apart from the first frame 210.

In addition, the second metal layer 320 may be disposed on the partition wall portion 130. The second metal layer 320 may be disposed on the first surface 131 and the second surface 132 of the partition wall portion 130. For example, the second metal layer 320 may be disposed on the entire region of the first surface 131 of the partition wall portion 130 and a partial region of the second surface 132. The second metal layer 320 may be in direct contact with the first surface 131 and the second surface 132 of the partition wall portion 130.

The second metal layer 320 may be connected to each other and disposed on the upper surface of the second frame 220, a part of the upper surface of the first body portion 110, the first surface 131 of the partition wall portion 130, the second surface 132 of the partition wall portion 130, the first to fourth inner surfaces IS1, IS2, IS3, and IS4, and the upper surface of the second body 120.

The first and second metal layers 310 and 320 may be spaced apart from each other. For example, the first and second metal layers 310 and 320 may have a first distance d1 defined as a distance in the first direction and a second distance d2 defined as a distance in the second direction. The first and second distances d1 and d2 may correspond to each other. The first and second distances d1 and d2 may be constant. That is, the first and second metal layers 310 and 320 may be disposed to be spaced apart at a constant distance.

The first distance d1 and the second distance d2 may be about 10 µm to about 180 µm. In detail, the first distance d1 and the second distance d2 may be about 15 µm to about 170 µm. Preferably, the first distance d1 and the second distance d2 may be about 20 µm to about 150 µm. When the first and second distances d1 and d2 are less than about 10 µm, a separation distance between the first and second metal layers 310 and 320 is insufficient, so that an electric short may occur. In addition, the separation distance may not be sufficient in a process of forming an exposed region by separating the first and second metal layers, and thus a process failure may occur. In addition, when the first and second distances d1 and d2 exceed about 180 µm, it may be difficult to secure a region in which the light-emitting device 500 is disposed. Therefore, it is preferable that the first and second distances d1 and d2 satisfy the above-described range.

The through portion 150 may be disposed between the first and second metal layers 310 and 320. The through portion 150 may be disposed on the body portion 110. The through portion 150 may be disposed on the separation portion. The through portion 150 may be spaced apart from the first to fourth inner surfaces IS1, IS2, IS3, and IS4. That is, the through portion 150 may be spaced apart from the second body portion 120. In addition, the through portion 150 may be disposed on the partition wall portion 130. The through portion 150 may be disposed on the second surface 132.

The through portion 150 may be disposed around the first metal layer 310. For example, the through portion 150 may have a predetermined width as shown in FIGS. 13 and 14, and may be disposed surrounding a circumference of the first metal layer 310. The through portion 150 may have a predetermined width and may be disposed in the entire region of the circumference of the first metal layer 310. The through portion 150 may expose the upper surface of the body 100. For example, the through portion 150 may expose the upper surface of the first body portion 110 and an upper surface of the partition wall portion 130.

A width of the through portion 150 may correspond to a distance between the first and second metal layers 310 and 320. The width of the through portion 150 may correspond to the distance d1 and the distance d2. The through portion 150 may have a predetermined width. The width of the through portion 150 may be about 10 µm to about 180 µm. In detail, the width of the through portion 150 may be about 15 µm to about 170 µm. Preferably, the width of the through portion 150 may be about 20 µm to about 150 µm.

That is, in the embodiment, light emitted from the light-emitting device 500 may be effectively reflected by the partition wall portion 130. For example, as the metal layer is disposed on the partition wall portion 130, the light emitted from the light-emitting device 500 may be effectively reflected on the upper portion. Accordingly, it is possible to improve light extraction efficiency and luminous flux of the light-emitting element package 1100 according to the embodiment.

In addition, the light-emitting device 500 may be disposed on the first metal layer 310 to be electrically connected to the first frame 210. In addition, the wire 600 may be disposed between the light-emitting device 500 and the second metal layer 320 so that the light-emitting device 500 may be electrically connected to the second frame 220. The wire 600 may extend from the light-emitting device 500 to be connected to the second metal layer 320 disposed on the second surface 132 of the partition wall portion 130. In this case, since the partition wall portion 130 protrudes from the upper surface of the first body portion 110, a linear distance between both ends of the wire 600 may be shortened. In addition, a difference in height between both ends of the wire 600 may be reduced. Accordingly, it is possible to prevent the open failure of the wire 600 connecting the light-emitting device 500 and the second metal layer 320.

Figure 15:
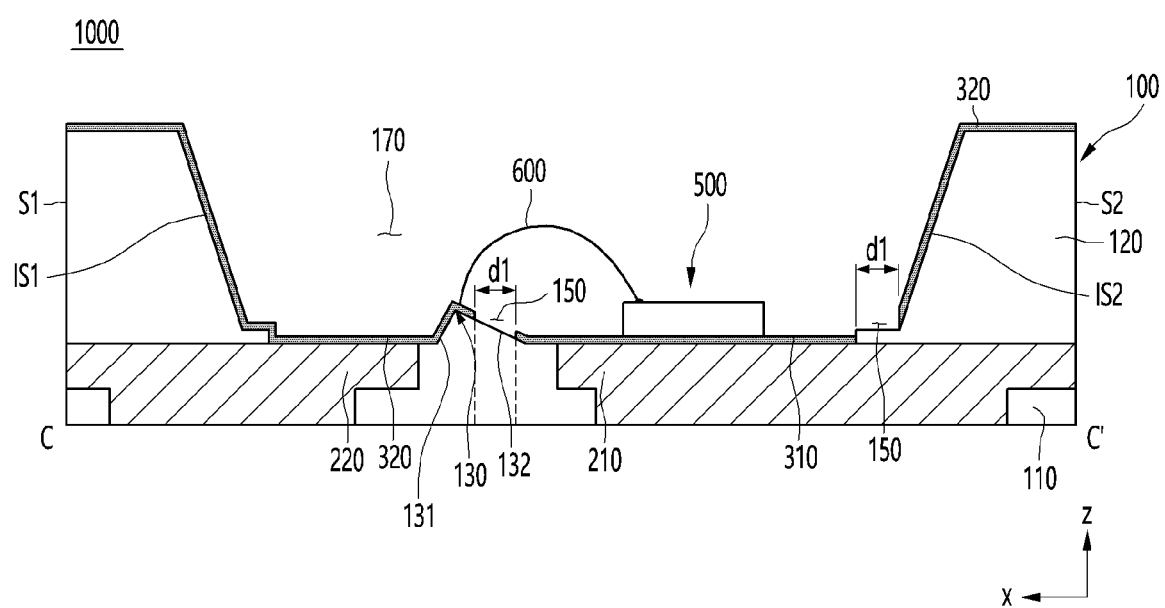
FIGS. 15 to 21 are views illustrating an example in which a position in which a through portion is formed in the light-emitting element package of FIG. 13 is modified.

Referring to FIG. 15, the first metal layer 310 may be disposed on the first frame 210. The first metal layer 310 may be disposed at a position vertically overlapped with the first frame 210. The first metal layer 310 may be in direct contact with the upper surface of the first frame 210. In addition, the first metal layer 310 may be disposed on the upper surface of the body 100 exposed by the cavity 170. For example, the first metal layer 310 may be disposed on the upper surface of the first body portion 110 exposed by the cavity 170.

The first metal layer 310 may be disposed to be spaced apart from the second frame 220. The first metal layer 310 may be disposed to be spaced apart from the second metal layer 320. In addition, the first metal layer 310 may be disposed to be spaced apart from the first to fourth inner surfaces IS1, IS2, IS3, and IS4. In addition, the first metal layer 310 may be disposed on the partition wall portion 130. The first metal layer 310 may be disposed on the second surface 132 of the partition wall portion 130, and may be disposed to be spaced apart from the first surface 131 of the partition wall portion 130. For example, the first metal layer 310 may be disposed on a partial region of the second surface 132 of the partition wall portion 130. The first metal layer 310 may be in direct contact with the second surface 132 of the partition wall portion 130.

The length in the second direction of the first metal layer 310 may be different from the length in the first direction of the first frame 210. For example, the length in the first direction of the first metal layer 310 may be longer than the length in the first direction of the first frame 210. Accordingly, the area of the first metal layer 310 may be larger than that of the upper surface of the first frame 210 of the lower surface of the cavity 170. The first metal layer 310 may be disposed to cover the entire upper surface of the first frame 210 exposed to the lower surface of the cavity 170.

The second metal layer 320 may be disposed to be spaced apart from the first metal layer 310. The second metal layer 320 may be disposed on the second frame 220. The second metal layer 320 may be disposed at a position vertically overlapped with the second frame 220. The second metal layer 320 may be in direct contact with the upper surface of the second frame 220. The second metal layer 320 may be disposed on the upper surface of the body 100 exposed by the cavity 170. For example, the second metal layer 320 may be disposed on the upper surface of the first body portion 110 exposed by the cavity 170. In addition, the second metal layer 320 may be disposed on the first to fourth inner surfaces IS1, IS2, IS3, and IS4 formed by the cavity 170. In detail, the second metal layer 320 may be disposed at a position vertically overlapped with the first to fourth inner surfaces IS1, IS2, IS3, and IS4. The second metal layer 320 may be in direct contact with the first to fourth inner surfaces IS1, IS2, IS3, and IS4. The second metal layer 320 may be disposed on the entire region of the first to fourth inner surfaces IS1, IS2, IS3, and IS4.

In addition, the second metal layer 320 may be disposed on the upper surface of the body 100, for example, the upper surface of the second body portion 120. The second metal layer 320 may be disposed at a position vertically overlapped with the upper surface of the second body portion 120. The second metal layer 320 may be in direct contact with the upper surface of the second body portion 120. The second metal layer 320 may be disposed on the entire region of the upper surface of the second body portion 120. In addition, the second metal layer 320 may be disposed to be spaced apart from the first frame 210.

In addition, the second metal layer 320 may be disposed on the partition wall portion 130. The second metal layer 320 may be disposed on the first surface 131 and the second surface 132 of the partition wall portion 130. For example, the second metal layer 320 may be disposed on the entire region of the first surface 131 and a partial region of the second surface 132. The second metal layer 320 disposed on the second surface 132 may be disposed to be spaced apart from the first metal layer 310 disposed on the second surface 132. The first metal layer 310 may be in direct contact with the first surface 131 and the second surface 132 of the partition wall portion 130.

The second metal layer 320 may be connected to each other and disposed on the upper surface of the second frame 220, a part of the upper surface of the first body portion 110, the first surface 131 of the partition wall portion 130, the first to fourth inner surfaces IS1, IS2, IS3, and IS4, and the upper surface of the second body 120.

The first and second metal layers 310 and 320 may be spaced apart from each other. For example, the first and second metal layers 310 and 320 may have a first distance d1 defined as a distance in the first direction and a second distance d2 defined as a distance in the second direction. The first and second distances d1 and d2 may correspond to each other. The first and second distances d1 and d2 may be constant. That is, the first and second metal layers 310 and 320 may be disposed to be spaced apart at a constant distance.

The first distance d1 and the second distance d2 may be about 10 μm to about 180 μm. In detail, the first distance d1 and the second distance d2 may be about 15 μm to about 170 μm. Preferably, the first distance d1 and the second distance d2 may be about 20 μm to about 150 μm.

The through portion 150 may be disposed between the first and second metal layers 310 and 320. The through portion 150 may be disposed on the body portion 110. The through portion 150 may be disposed on the separation portion. The through portion 150 may be spaced apart from the first to fourth inner surfaces IS1, IS2, IS3, and IS4. That is, the through portion 150 may be spaced apart from the second body portion 120. In addition, the through portion 150 may be disposed on the partition wall portion 130. The through portion 150 may be disposed on the second surface 132.

The through portion 150 may be disposed around the first metal layer 310. For example, the through portion 150 may have a predetermined width as shown in FIG. 12, and may be disposed surrounding a circumference of the first metal layer 310. The through portion 150 may have a predetermined width and may be disposed in the entire region of the circumference of the first metal layer 310. The through portion 150 may expose the upper surface of the body 100. For example, the through portion 150 may expose the upper surface of the first body portion 110 and the upper surface of the partition wall portion 130. In detail, the through portion 150 may expose the upper surface of the first body portion 110 and the second surface 132 of the partition wall portion 130. A width of the through portion 150 may correspond to a distance between the first and second metal layers 310 and 320. The width of the through portion 150 may correspond to the distance d1 and the distance d2. The through portion 150 may have a predetermined width. The width of the through portion 150 may be about 10 μm to about 180 μm. In detail, the width of the through portion 150 may be about 15 μm to about 170 μm. Preferably, the width of the through portion 150 may be about 20 μm to about 150 μm.

That is, in the embodiment, light emitted from the light-emitting device 500 may be effectively reflected by the partition wall portion 130. For example, as the metal layer is disposed on the partition wall portion 130, the light emitted from the light-emitting device 500 may be effectively reflected on the upper portion. Accordingly, it is possible to improve light extraction efficiency and luminous flux of the light-emitting element package 1100 according to the embodiment.

In addition, the light-emitting device 500 may be disposed on the first metal layer 310 to be electrically connected to the first frame 210. In addition, the wire 600 may be disposed between the light-emitting device 500 and the second metal layer 320 so that the light-emitting device 500 may be electrically connected to the second frame 220. The wire 600 may extend from the light-emitting device 500 to be connected to the second metal layer 320 disposed on the second surface 132 of the partition wall portion 130. In this case, since the partition wall portion 130 protrudes from the upper surface of the first body portion 110, a linear distance between both ends of the wire 600 may be shortened. In addition, a difference in height between both ends of the wire 600 may be reduced. Accordingly, it is possible to prevent the open failure of the wire 600 connecting the light-emitting device 500 and the second metal layer 320.

Figure 16:
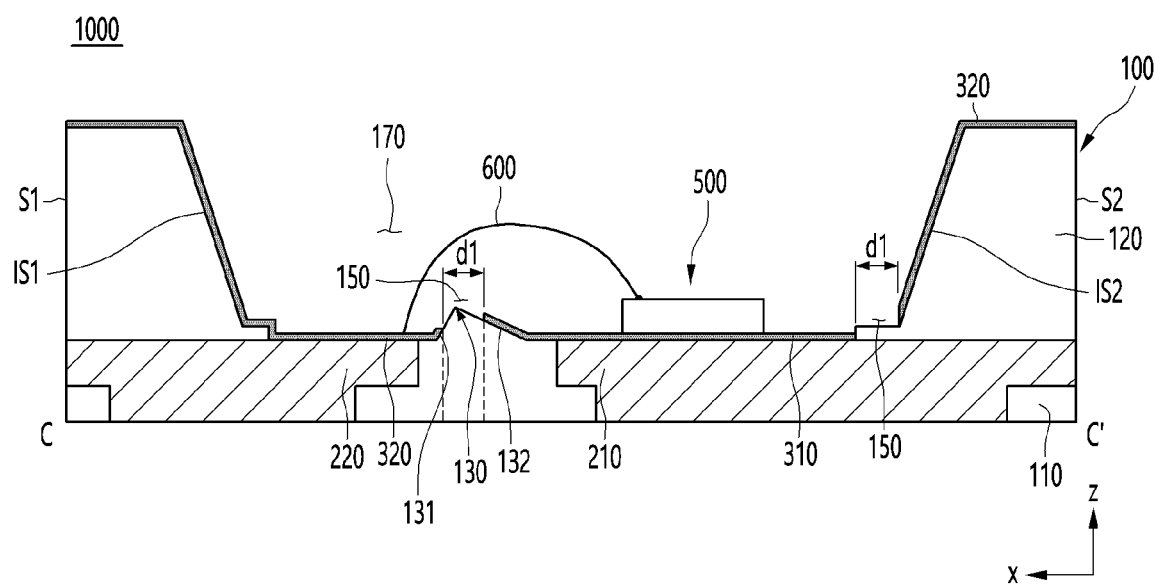

Referring to FIG. 16, the first metal layer 310 may be disposed on the first frame 210. The first metal layer 310 may be disposed at a position vertically overlapped with the first frame 210. The first metal layer 310 may be in direct contact with the upper surface of the first frame 210. In addition, the first metal layer 310 may be disposed on the upper surface of the body 100 exposed by the cavity 170. For example, the first metal layer 310 may be disposed on the upper surface of the first body portion 110 exposed by the cavity 170.

The first metal layer 310 may be disposed to be spaced apart from the second frame 220. The first metal layer 310 may be disposed to be spaced apart from the second metal layer 320. In addition, the first metal layer 310 may be disposed to be spaced apart from the first to fourth inner surfaces IS1, IS2, IS3, and IS4. In addition, the first metal layer 310 may be disposed on the partition wall portion 130. The first metal layer 310 may be disposed on the second surface 132 of the partition wall portion 130, and may be disposed to be spaced apart from the first surface 131 of the partition wall portion 130. For example, the first metal layer 310 may be disposed on a partial region of the second surface 132 of the partition wall portion 130. The first metal layer 310 may be in direct contact with the second surface 132 of the partition wall portion 130.

The length in the second direction of the first metal layer 310 may be different from the length in the first direction of the first frame 210. For example, the length in the first direction of the first metal layer 310 may be longer than the length in the first direction of the first frame 210. Accordingly, the area of the first metal layer 310 may be larger than that of the upper surface of the first frame 210 of the lower surface of the cavity 170. The first metal layer 310 may be disposed to cover the entire upper surface of the first frame 210 exposed to the lower surface of the cavity 170.

The second metal layer 320 may be disposed to be spaced apart from the first metal layer 310. The second metal layer 320 may be disposed on the second frame 220. The second metal layer 320 may be disposed at a position vertically overlapped with the second frame 220. The second metal layer 320 may be in direct contact with the upper surface of the second frame 220. The second metal layer 320 may be disposed on the upper surface of the body 100 exposed by the cavity 170. For example, the second metal layer 320 may be disposed on the upper surface of the first body portion 110 exposed by the cavity 170. In addition, the second metal layer 320 may be disposed on the first to fourth inner surfaces IS1, IS2, IS3, and IS4 formed by the cavity 170. In detail, the second metal layer 320 may be disposed at a position vertically overlapped with the first to fourth inner surfaces IS1, IS2, IS3, and IS4. The second metal layer 320 may be in direct contact with the first to fourth inner surfaces IS1, IS2, IS3, and IS4. The second metal layer 320 may be disposed on the entire region of the first to fourth inner surfaces IS1, IS2, IS3, and IS4.

In addition, the second metal layer 320 may be disposed on the upper surface of the body 100, for example, the upper surface of the second body portion 120. The second metal layer 320 may be disposed at a position vertically overlapped with the upper surface of the second body portion 120. The second metal layer 320 may be in direct contact with the upper surface of the second body portion 120. The second metal layer 320 may be disposed on the entire region of the upper surface of the second body portion 120. In addition, the second metal layer 320 may be disposed to be spaced apart from the first frame 210.

In addition, the second metal layer 320 may be disposed on the partition wall portion 130. The second metal layer 320 may be disposed on the first surface 131 of the partition wall portion 130, and may be disposed to be space apart from the second surface 132. For example, the second metal layer 320 may be disposed on a partial region of the first surface 131. The first metal layer 310 may be in direct contact with the first surface 131 of the partition wall portion 130.

The second metal layer 320 may be connected to each other and disposed on the upper surface of the second frame 220, a part of the upper surface of the first body portion 110, the first surface 131 of the partition wall portion 130, the first to fourth inner surfaces IS1, IS2, IS3, and IS4, and the upper surface of the second body 120.

The first and second metal layers 310 and 320 may be spaced apart from each other. For example, the first and second metal layers 310 and 320 may have a first distance d1 defined as a distance in the first direction and a second distance d2 defined as a distance in the second direction. The first and second distances d1 and d2 may correspond to each other. The first and second distances d1 and d2 may be constant. That is, the first and second metal layers 310 and 320 may be disposed to be spaced apart at a constant distance.

The first distance d1 and the second distance d2 may be about 10 μm to about 180 μm. In detail, the first distance d1 and the second distance d2 may be about 15 μm to about 170 μm. Preferably, the first distance d1 and the second distance d2 may be about 20 μm to about 150 μm.

The through portion 150 may be disposed between the first and second metal layers 310 and 320. The through portion 150 may be disposed on the body portion 110. The through portion 150 may be disposed on the separation portion. The through portion 150 may be spaced apart from the first to fourth inner surfaces IS1, IS2, IS3, and IS4. That is, the through portion 150 may be spaced apart from the second body portion 120. In addition, the through portion 150 may be disposed on the partition wall portion 130. The through portion 150 may be disposed on the first surface 131 and the second surface 132.

The through portion 150 may be positioned around the first metal layer 310. For example, the through portion 150 may have a predetermined width as shown in FIG. 13, and may be disposed surrounding a circumference of the first metal layer 310. The through portion 150 may have a predetermined width and may be disposed in the entire region of the circumference of the first metal layer 310. The through portion 150 may expose the upper surface of the body 100. For example, the through portion 150 may expose the upper surface of the first body portion 110 and the first surface 131 and the second surface 132 of the partition wall portion 130.

A width of the through portion 150 may correspond to a distance between the first and second metal layers 310 and 320. The width of the through portion 150 may correspond to the distance d1 and the distance d2. The through portion 150 may have a predetermined width. The width of the through portion 150 may be about 10 μm to about 180 μm. In detail, the width of the through portion 150 may be about 15 μm to about 170 μm. Preferably, the width of the through portion 150 may be about 20 μm to about 150 μm.

That is, in the embodiment, light emitted from the light-emitting device 500 may be effectively reflected by the partition wall portion 130. For example, as the first metal layer 310 is disposed on the second surface 132 of the partition wall portion 130, the light emitted from the light-emitting device 500 may be effectively reflected on the upper portion. Accordingly, it is possible to improve light extraction efficiency and luminous flux of the light-emitting element package 1100 according to the embodiment.

In addition, the light-emitting device 500 may be disposed on the first metal layer 310 to be electrically connected to the first frame 210. In addition, the wire 600 may be disposed between the light-emitting device 500 and the second metal layer 320 so that the light-emitting device 500 may be electrically connected to the second frame 220. The wire 600 may extend from the light-emitting device 500 to be connected to the second metal layer 320 disposed on the second surface 132 of the partition wall portion 130. In this case, since the partition wall portion 130 protrudes from the upper surface of the first body portion 110, a linear distance between both ends of the wire 600 may be shortened. In addition, a difference in height between both ends of the wire 600 may be reduced. Accordingly, it is possible to prevent the open failure of the wire 600 connecting the light-emitting device 500 and the second metal layer 320.

Figure 17:
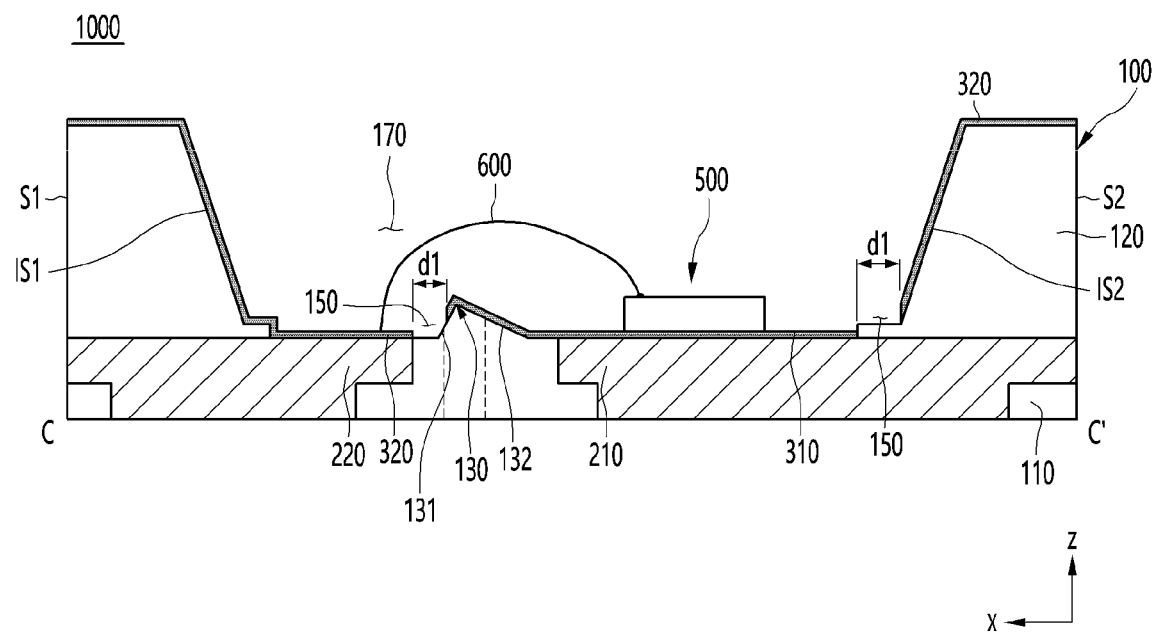

Referring to FIG. 17, the first metal layer 310 may be disposed on the first frame 210. The first metal layer 310 may be disposed at a position vertically overlapped with the first frame 210. The first metal layer 310 may be in direct contact with the upper surface of the first frame 210. In addition, the first metal layer 310 may be disposed on the upper surface of the body 100 exposed by the cavity 170. For example, the first metal layer 310 may be disposed on the upper surface of the first body portion 110 exposed by the cavity 170.

The first metal layer 310 may be disposed to be spaced apart from the second frame 220. The first metal layer 310 may be disposed to be spaced apart from the second metal layer 320. In addition, the first metal layer 310 may be disposed to be spaced apart from the first to fourth inner surfaces IS1, IS2, IS3, and IS4. In addition, the first metal layer 310 may be disposed on the partition wall portion 130. The first metal layer 310 may be disposed on the first surface 131 and the second surface 132 of the partition wall portion 130. For example, the first metal layer 310 may be disposed on a partial region of the first surface 131 and the entire region of the second surface 132 of the partition wall portion 130. The first metal layer 310 may be in direct contact with the first surface 131 and the second surface 132 of the partition wall portion 130.

The length in the second direction of the first metal layer 310 may be different from the length in the first direction of the first frame 210. For example, the length in the first direction of the first metal layer 310 may be longer than the length in the first direction of the first frame 210. Accordingly, the area of the first metal layer 310 may be larger than that of the upper surface of the first frame 210 of the lower surface of the cavity 170. The first metal layer 310 may be disposed to cover the entire upper surface of the first frame 210 exposed to the lower surface of the cavity 170.

The second metal layer 320 may be disposed to be spaced apart from the first metal layer 310. The second metal layer 320 may be disposed on the second frame 220. The second metal layer 320 may be disposed at a position vertically overlapped with the second frame 220. The second metal layer 320 may be in direct contact with the upper surface of the second frame 220. The second metal layer 320 may be disposed on the upper surface of the body 100 exposed by the cavity 170. For example, the second metal layer 320 may be disposed on the upper surface of the first body portion 110 exposed by the cavity 170. In addition, the second metal layer 320 may be disposed on the first to fourth inner surfaces IS1, IS2, IS3, and IS4 formed by the cavity 170. In detail, the second metal layer 320 may be disposed at a position vertically overlapped with the first to fourth inner surfaces IS1, IS2, IS3, and IS4. The second metal layer 320 may be in direct contact with the first to fourth inner surfaces IS1, IS2, IS3, and IS4. The second metal layer 320 may be disposed on the entire region of the first to fourth inner surfaces IS1, IS2, IS3, and IS4.

In addition, the second metal layer 320 may be disposed on the upper surface of the body 100, for example, the upper surface of the second body portion 120. The second metal layer 320 may be disposed at a position vertically overlapped with the upper surface of the second body portion 120. The second metal layer 320 may be in direct contact with the upper surface of the second body portion 120. The second metal layer 320 may be disposed on the entire region of the upper surface of the second body portion 120. In addition, the second metal layer 320 may be disposed to be spaced apart from the first frame 210.

In addition, the second metal layer 320 may be disposed to be spaced apart from the partition wall portion 130. For example, the second metal layer 320 may be disposed to be spaced apart from the first surface 131 and the second surface 132 of the partition wall portion 130.

The second metal layer 320 may be connected to each other and disposed on the upper surface of the second frame 220, a part of the upper surface of the first body portion 110, the first surface 131 of the partition wall portion 130, the first to fourth inner surfaces IS1, IS2, IS3, and IS4, and the upper surface of the second body 120.

The first and second metal layers 310 and 320 may be spaced apart from each other. For example, the first and second metal layers 310 and 320 may have a first distance d1 defined as a distance in the first direction and a second distance d2 defined as a distance in the second direction. The first and second distances d1 and d2 may correspond to each other. The first and second distances d1 and d2 may be constant. That is, the first and second metal layers 310 and 320 may be disposed to be spaced apart at a constant distance.

The first distance d1 and the second distance d2 may be about 10 μm to about 180 μm. In detail, the first distance d1 and the second distance d2 may be about 15 μm to about 170 μm. Preferably, the first distance d1 and the second distance d2 may be about 20 μm to about 150 μm.

The through portion 150 may be disposed between the first and second metal layers 310 and 320. The through portion 150 may be disposed on the body portion 110. The through portion 150 may be disposed on the separation portion of the body portion 110. The through portion 150 may be spaced apart from the first to fourth inner surfaces IS1, IS2, IS3, and IS4. That is, the through portion 150 may be spaced apart from the second body portion 120. In addition, the through portion 150 may be disposed on the partition wall portion 130. The through portion 150 may be disposed on the first surface 131 of the partition wall portion 130, and may be spaced apart from the second surface 132 of the partition wall portion 130.

The through portion 150 may be positioned around the first metal layer 310. For example, the through portion 150 may have a predetermined width as shown in FIG. 15, and may be disposed surrounding a circumference of the first metal layer 310. The through portion 150 may have a predetermined width and may be disposed in the entire region of the circumference of the first metal layer 310. The through portion 150 may expose the upper surface of the body 100. For example, the through portion 150 may expose the upper surface of the first body portion 110 and the upper surface of the partition wall portion 130. In detail, the through portion 150 may expose the upper surface of the first body portion 110 and the first surface 131 of the partition wall portion 130.

A width of the through portion 150 may correspond to a distance between the first and second metal layers 310 and 320. The width of the through portion 150 may correspond to the distance d1 and the distance d2. The through portion 150 may have a predetermined width. The width of the through portion 150 may be about 10 μm to about 180 μm. In detail, the width of the through portion 150 may be about 15 μm to about 160 μm. Preferably, the width of the through portion 150 may be about 20 μm to about 150 μm.

That is, in the embodiment, light emitted from the light-emitting device 500 may be effectively reflected by the partition wall portion 130. In detail, as the first metal layer 310 is disposed on the first surface 131 and the second surface 132 of the partition wall portion 130, the light emitted from the light-emitting device 500 may be effectively reflected on the upper portion. Accordingly, it is possible to improve light extraction efficiency and luminous flux of the light-emitting element package 1100 according to the embodiment.

In addition, in the embodiment, as the first metal layer 310 on which the light emitting device 500 is disposed is disposed on the first surface 131 and the second surface 132 of the partition wall portion 130, the through portion 150 may be positioned on the upper surface of the first body portion 110 and on the first surface 131 of the partition wall portion 130. Accordingly, it is possible to minimize that the light emitted from the light emitting device 500 is incident on the body 100, thereby improving the reliability of the package.

Figure 18:
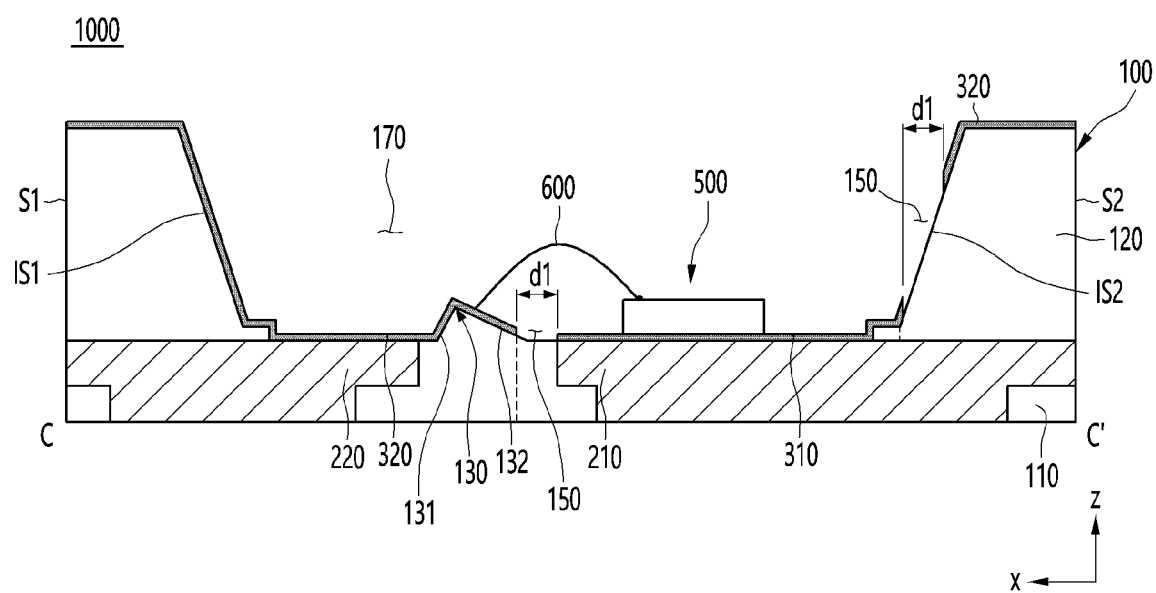

Referring to FIG. 18, the first metal layer 310 may be disposed on the first frame 210. The first metal layer 310 may be disposed at a position vertically overlapped with the first frame 210. The first metal layer 310 may be in direct contact with the upper surface of the first frame 210. In addition, the first metal layer 310 may be disposed on the upper surface of the body 100 exposed by the cavity 170. For example, the first metal layer 310 may be disposed on the upper surface of the first body portion 110 exposed by the cavity 170. The first metal layer 310 may be in direct contact with the upper surface of the first body portion 110 exposed by the cavity 170.

In addition, the first metal layer 310 may be disposed on at least one of the second to fourth inner surfaces IS2, IS3, and IS4 excluding the first inner surface IS1. As an example, the first metal layer 310 may be disposed on the second inner surface IS2, and may be disposed to be space apart from the first inner surface IS1, the third inner surface IS3, and the fourth inner surface IS4. In this case, the first metal layer 310 may be in direct contact with the second inner surface IS2. As another example, the first metal layer 310 may be disposed on the second to fourth inner surfaces IS2, IS3, and IS4, and may be disposed to be spaced apart from the first inner surface IS1. In this case, the first metal layer 310 may be in direct contact with the second to fourth inner surfaces IS2, IS3, and IS4.

In addition, the first metal layer 310 may be disposed to be spaced apart from the partition wall portion 130. For example, the first metal layer 310 may be disposed to be spaced apart from the second surface 132 of the partition wall portion 130.

The length in the second direction of the first metal layer 310 may be different from the length in the first direction of the first frame 210. For example, the length in the first direction of the first metal layer 310 may be longer than the length in the first direction of the first frame 210. Accordingly, the area of the first metal layer 310 may be larger than the area of the upper surface of the first frame 210 of the lower surface of the cavity 170. The first metal layer 310 may be disposed to cover the entire upper surface of the first frame 210 exposed to the lower surface of the cavity 170.

The second metal layer 320 may be disposed to be spaced apart from the first metal layer 310. The second metal layer 320 may be disposed on the second frame 220. The second metal layer 320 may be disposed at a position vertically overlapped with the second frame 220. The second metal layer 320 may be in direct contact with the upper surface of the second frame 220. The second metal layer 320 may be disposed on the upper surface of the body 100 exposed by the cavity 170. For example, the second metal layer 320 may be disposed on the upper surface of the first body portion 110 exposed by the cavity 170. In this case, the second metal layer 320 may be disposed on the upper surface of the first body portion 110 not overlapped with the first metal layer 310.

In addition, the second metal layer 320 may be disposed on the first to fourth inner surfaces IS1, IS2, IS3, and IS4 formed by the cavity 170. The second metal layer 320 may be disposed at a position perpendicular to the first to fourth inner surfaces IS1, IS2, IS3, and IS4. The second metal layer 320 may be in direct contact with the first to fourth inner surfaces IS1, IS2, IS3, and IS4. As an example, when the first metal layer 310 is disposed on a partial region of the second inner surface IS2, the second metal layer 320 may be disposed on the entire region of the first inner surface IS1, the entire region of the third inner surface IS3, and the entire region of the fourth inner surface IS4, and may be disposed on a partial region of the second inner surface IS2 in which the first metal layer 310 is not disposed. As another example, when the first metal layer 310 is disposed on partial regions of the second to fourth inner surfaces IS2, IS3, and IS4, the second metal layer 320 may be disposed on the entire region of the first inner surface IS1 and a partial region of each of the second to fourth inner surfaces IS2, IS3, and IS4. In detail, the second metal layer 320 disposed on the second to fourth inner surfaces IS2, IS3, and IS4 may be disposed on a region not overlapped with the first metal layer 310. Accordingly, the area of the second metal layer 320 disposed on the first inner surface IS1 may be larger than the area of the second metal layer 320 disposed on the second inner surface IS2. In addition, the area of the second metal layer 320 disposed on the first inner surface IS1 may be larger than the area of the second metal layer 320 disposed on the third and fourth inner surfaces IS3 and IS4.

In addition, the second metal layer 320 may be disposed on the upper surface of the body 100, for example, the upper surface of the second body portion 120. The second metal layer 320 may be disposed at a position vertically overlapped with the upper surface of the second body 120. The second metal layer 320 may be in direct contact with the upper surface of the second body portion 120. The second metal layer 320 may be disposed on the entire upper surface of the second body portion 120. In addition, the second metal layer 320 may be disposed to be spaced apart from the first frame 210.

In addition, the second metal layer 320 may be disposed on the partition wall portion 130. For example, the second metal layer 320 may be disposed on the first surface 131 and the second surface 132 of the partition wall portion 130. For example, the second metal layer 320 may be disposed on the entire region of the first surface 131 and a partial region of the second surface 132 of the partition wall portion 130. The second metal layer 320 may be in direct contact with the first surface 131 and the second surface 132 of the partition wall portion 130.

The second metal layer 320 may be connected to each other and disposed on the upper surface of the second frame 220, a part of the upper surface of the first body portion 110, the first surface 131 of the partition wall portion 130, the second surface 132 of the partition wall portion 130, the first to fourth inner surfaces IS1, IS2, IS3, IS4, and the upper surface of the second body 120.

The first and second metal layers 310 and 320 may be spaced apart from each other. For example, the first and second metal layers 310 and 320 may have a first distance d1 defined as a distance in the first direction and a second distance d2 defined as a distance in the second direction. The first and second distances d1 and d2 may correspond to each other. The first and second distances d1 and d2 may be constant. That is, the first and second metal layers 310 and 320 may be disposed to be spaced apart at a constant distance.

The first distance d1 and the second distance d2 may be about 10 μm to about 180 μm. In detail, the first distance d1 and the second distance d2 may be about 15 μm to about 160 μm. Preferably, the first distance d1 and the second distance d2 may be about 20 μm to about 150 μm.

The through portion 150 may be disposed between the first and second metal layers 310 and 320. The through portion 150 may be disposed on the first body portion 110. The through portion 150 may be disposed on the separation portion. In addition, the through portion 150 may be disposed on the second body portion 120. In detail, the through portion 150 may be disposed on at least one of the second to fourth inner surfaces IS2, IS3, and IS4. As an example, when the first metal layer 310 is disposed on the second inner surface IS2, the through portion 150 may be disposed on the second inner surface IS2. As another example, when the first metal layer 310 is disposed on the second to fourth inner surfaces IS2, IS3, and IS4, the through portion 150 may be disposed on the second to fourth inner surfaces IS2, IS3, and IS4. In addition, the through portion 150 may be disposed on the partition wall portion 130. The through portion 150 may be disposed on the second surface 132.

The through portion 150 may be positioned around the first metal layer 310. For example, the through portion 150 may have a predetermined width, and may be disposed surrounding a circumference of the first metal layer 310. The through portion 150 may have a predetermined width and may be disposed in the entire region of the circumference of the first metal layer 310. The through portion 150 may expose the upper surface of the body 100, the inner surface of the second body portion 120, and the second surface 132 of the partition wall portion 130. A width of the through portion 150 may correspond to a distance between the first and second metal layers 310 and 320. The width of the through portion 150 may correspond to the distance d1 and the distance d2. The through portion 150 may have a predetermined width. The width of the through portion 150 may be about 10 μm to about 180 μm. In detail, the width of the through portion 150 may be about 15 μm to about 160 μm. Preferably, the width of the through portion 150 may be about 20 μm to about 150 μm.

In addition, although not shown in the drawing, the through portion 150 may be disposed on a region vertically overlapped with the first surface 131 of the partition wall portion 130, and may be spaced apart from the second surface 132. In addition, the through portion 150 may be positioned on a region vertically overlapped with the first surface 131 and the second surface 132 of the partition wall portion 130. For example, the first metal layer 310 may be disposed on the first surface 131 of the partition wall portion 130 so that the through portion 150 may be positioned the region vertically overlapped with the first surface 131 of the partition wall portion 130.

That is, in the embodiment, light emitted from the light-emitting device 500 may be effectively reflected by the partition wall portion 130. In detail, as the metal layer is disposed on the first surface 131 and the second surface 132 of the partition wall portion 130, the light emitted from the light-emitting device 500 may be effectively reflected upward. Accordingly, it is possible to improve light extraction efficiency and luminous flux of the light-emitting element package 1100 according to the embodiment.

In addition, in the embodiment, as the first metal layer 310 on which the light-emitting device 500 is disposed is disposed on the first surface 131 and the second surface 132 of the partition wall portion 130, the through portion 150 may be positioned on the upper surface of the first body portion 110 and on the first surface 131 of the partition wall portion 130. Accordingly, it is possible to minimize that light emitted from the light-emitting device 500 is incident on the body 100, thereby improving the reliability of the package.

In addition, the light-emitting device 500 may be disposed on the first metal layer 310 to be electrically connected to the first frame 210. In addition, the wire 600 may be disposed between the light-emitting device 500 and the second metal layer 320 so that the light-emitting device 500 may be electrically connected to the second frame 220. The wire 600 may extend from the light-emitting device 500 to be connected to the second metal layer 320 disposed on the first surface 131 of the partition wall portion 130. In this case, since the partition wall portion 130 protrudes from the upper surface of the first body portion 110, a linear distance between both ends of the wire 600 may be shortened. In addition, a difference in height between both ends of the wire 600 may be reduced. Accordingly, it is possible to prevent an open failure of the wire 600 connecting between the light-emitting device 500 and the second metal layer 320.

Figure 19:
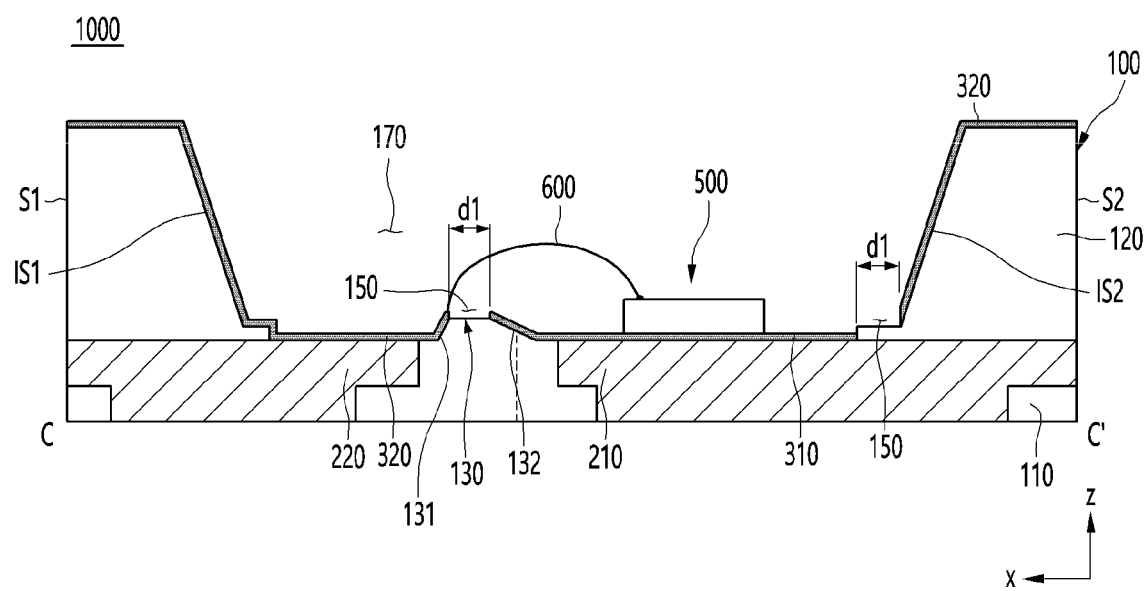

Referring to FIG. 19, the partition wall portion 130 may include a plurality of surfaces. For example, the partition wall portion 130 may include the first surface 131 facing the first inner surface IS1, the second surface 132 facing the second inner surface IS2, and an upper surface connecting the first surface 131 and the second surface 132. The upper surface of the partition wall portion 130 may be parallel to the upper surface of the body 100. In detail, the upper surface of the partition wall portion 130 may be parallel to the upper surface of the first body portion 110. The upper surface of the partition wall portion 130 may be parallel to the upper surface of the second body portion 120. In addition, the first surface 131 and the second surface 132 of the partition wall portion 130 may be inclined with respect to the upper surface of the first body portion 110. For example, the first surface 131 may have a first inclination angle with respect to the upper surface of the first body portion 110, and the second surface may have a second inclination angle with respect to the upper surface of the second body portion 120. The first inclination angle of the first surface 131 may be different from the second inclination angle of the second surface 132. Each of the first and second inclination angles is an alternate angle, and the first inclination angle may be smaller than the second inclination angle.

The first surface 131 and the second surface 132 may include at least one of a flat surface and a curved surface. For example, the first surface 131 may be a curved surface and the second surface 132 may be a flat surface. As another example, the first surface 131 may include both a flat surface and a curved surface, and the second surface 132 may be a flat surface. A distance between the first surface 131 and the second surface 132 may decrease upward from the upper surface of the first body portion 110.

The first metal layer 310 may be disposed on the first frame 210. The first metal layer 310 may be disposed at a position vertically overlapped with the first frame 210. The first metal layer 310 may be in direct contact with the upper surface of the first frame 210. In addition, the first metal layer 310 may be disposed on the upper surface of the body 100 exposed by the cavity 170. For example, the first metal layer 310 may be disposed on the upper surface of the first body portion 110 exposed by the cavity 170.

The first metal layer 310 may be disposed to be spaced apart from the second frame 220. The first metal layer 310 may be disposed to be spaced apart from the second metal layer 320. In addition, the first metal layer 310 may be disposed to be spaced apart from the first to fourth inner surfaces IS1, IS2, IS3, and IS4. In addition, the first metal layer 310 may be disposed on the partition wall portion 130.

For example, the first metal layer 310 may be disposed on the second surface 132 of the partition wall portion 130, and may be disposed spaced apart from the first surface 131 of the partition wall portion 130. The first metal layer 310 may be in direct contact with the second surface 132 of the partition wall portion 130.

The length in the second direction of the first metal layer 310 may be different from the length in the first direction of the first frame 210. For example, the length in the first direction of the first metal layer 310 may be longer than the length in the first direction of the first frame 210. Accordingly, the area of the first metal layer 310 may be larger than that of the upper surface of the first frame 210 on the lower surface of the cavity 170. The first metal layer 310 may be disposed to cover the entire upper surface of the first frame 210 exposed to the lower surface of the cavity 170.

The second metal layer 320 may be disposed to be spaced apart from the first metal layer 310. The second metal layer 320 may be disposed on the second frame 220. The second metal layer 320 may be disposed at a position vertically overlapped with the second frame 220. The second metal layer 320 may be in direct contact with the upper surface of the second frame 220. The second metal layer 320 may be disposed on the upper surface of the body 100 exposed by the cavity 170. For example, the second metal layer 320 may be disposed on the upper surface of the first body portion 110 exposed by the cavity 170. In addition, the second metal layer 320 may be disposed on the first to fourth inner surfaces IS1, IS2, IS3, and IS4 formed by the cavity 170. In detail, the second metal layer 320 may be disposed at a position perpendicular to the first to fourth inner surfaces IS1, IS2, IS3, and IS4. The second metal layer 320 may be in direct contact with the first to fourth inner surfaces IS1, IS2, IS3, and IS4. The second metal layer 320 may be disposed on the entire region of the first to fourth inner surfaces IS1, IS2, IS3, and IS4.

In addition, the second metal layer 320 may be disposed on the partition wall portion 130. For example, the second metal layer 320 may be disposed on the first surface 131 of the partition wall portion 130, and may be disposed spaced apart from the second surface 132. The first metal layer 310 may be in direct contact with the first surface 131 of the partition wall portion 130.

The second metal layer 320 may be connected to each other and disposed on the upper surface of the second frame 220, a part of the upper surface of the first body portion 110, the first surface 131 of the partition wall portion 130, the first to fourth The inner surfaces IS1, IS2, IS3, and IS4, and the upper surface of the second body 120.

The first and second metal layers 310 and 320 may be spaced apart from each other. For example, the first and second metal layers 310 and 320 may have a first distance d1 defined as a distance in the first direction and a second distance d2 defined as a distance in the second direction. The first and second distances d1 and d2 may correspond to each other. The first and second distances d1 and d2 may be constant. That is, the first and second metal layers 310 and 320 may be disposed to be spaced apart at a constant distance.

The first distance d1 and the second distance d2 may be about 10 µm to about 180 µm. In detail, the first distance d1 and the second distance d2 may be about 15 µm to about 160 µm. Preferably, the first distance d1 and the second distance d2 may be about 20 µm to about 150 µm.

The through portion 150 may be disposed between the first and second metal layers 310 and 320. The through portion 150 may be disposed on the first body portion 110. The through portion 150 may be disposed on the separation portion. The through portion 150 may be spaced apart from the first to fourth inner surfaces IS1, IS2, IS3, and IS4. That is, the through portion 150 may be spaced apart from the second body portion 120. In addition, the through portion 150 may be disposed on the partition wall portion 130. The through portion 150 may be disposed on the upper surface of the partition wall portion 130.

The through portion 150 may be positioned around the first metal layer 310. For example, the through portion 150 may have a predetermined width as shown in FIG. 17, and may be disposed surrounding a circumference of the first metal layer 310. The through portion 150 may have a predetermined width and may be disposed in the entire region of the circumference of the first metal layer 310. The through portion 150 may expose the upper surface of the body 100. For example, the through portion 150 may expose the upper surface of the first body portion 110 and the upper surface of the partition wall portion 130. In detail, the through portion 150 may expose the upper surface of the first body portion 110 and the first surface 131 of the partition wall portion 130.

A width of the through portion 150 may correspond to a distance between the first and second metal layers 310 and 320. The width of the through portion 150 may correspond to the distance d1 and the distance d2. The through portion 150 may have a predetermined width. The width of the through portion 150 may be about 10 µm to about 180 µm. In detail, the width of the through portion 150 may be about 15 µm to about 160 µm. Preferably, the width of the through portion 150 may be about 20 µm to about 150 µm.

That is, in the embodiment, light emitted from the light-emitting device 500 may be effectively reflected by the partition wall portion 130. In detail, the second metal layer 320 may be disposed on the first surface 131 of the partition wall portion 130, and the first metal layer 310 may be disposed on the second surface 132 so that the light emitted from the light-emitting device 500 may be effectively reflected upward. Accordingly, it is possible to improve light extraction efficiency and luminous flux of the light-emitting element package 1100 according to the embodiment.

In addition, in the embodiment, the through portion 150 may be positioned on the upper surface of the partition wall portion 130. Accordingly, it is possible to minimize that the light emitted from the light-emitting device 500 is incident on the body 100, thereby improving the reliability of the package.

In addition, the wire 600 may extend from the light-emitting device 500 to be connected to the second metal layer 320 disposed on the first surface 131 of the partition wall portion 130. In this case, since the partition wall portion 130 protrudes from the upper surface of the first body portion 110, a linear distance between both ends of the wire 600 may be shortened. In addition, a difference in height between both ends of the wire 600 may be reduced. Accordingly, it is possible to prevent an open failure of the wire 600 connecting between the light-emitting device 500 and the second metal layer 320.

Figure 20:
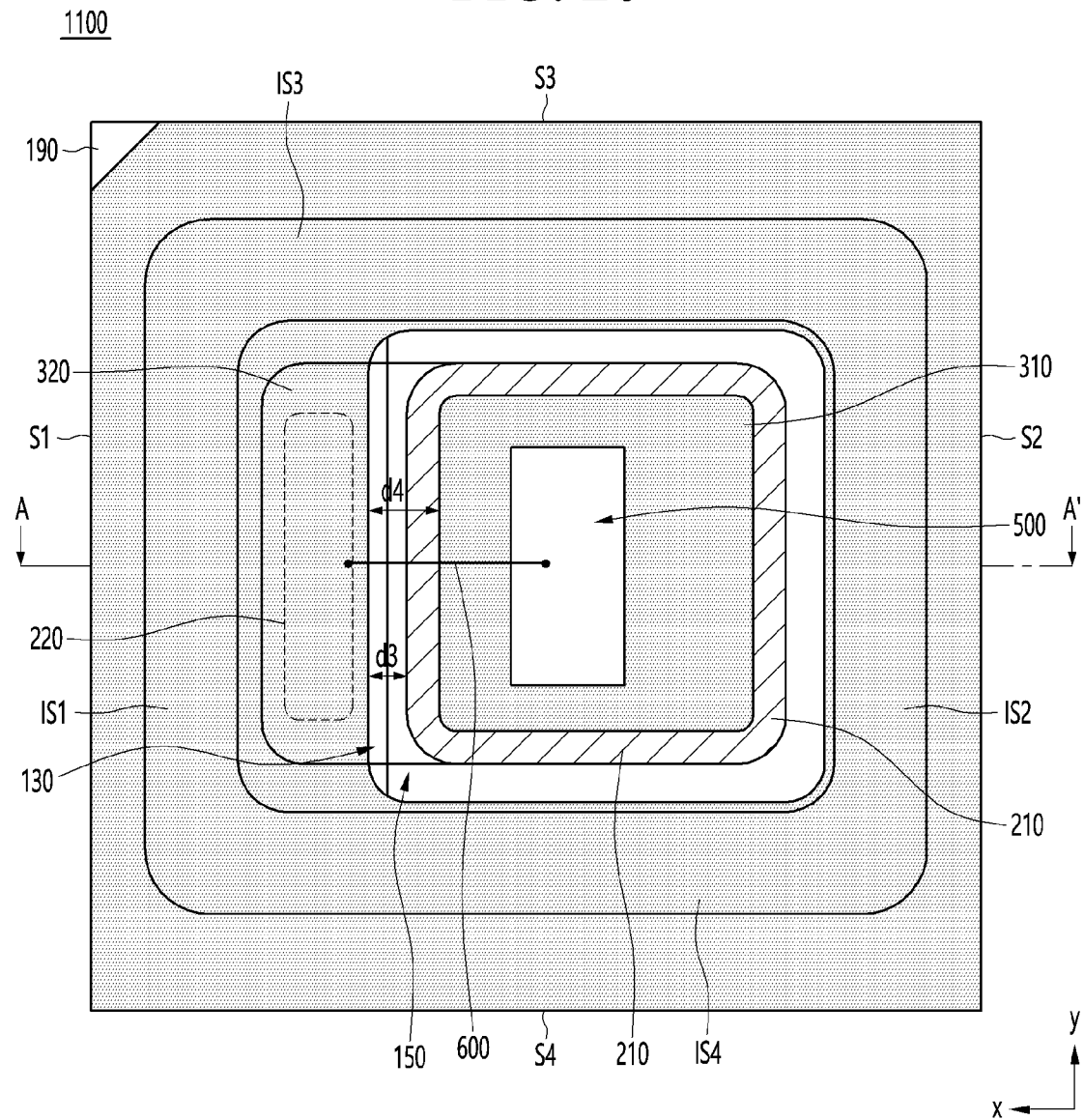

Referring to FIGS. 20 and 21, the first metal layer 310 may be disposed on the first frame 210. The first metal layer 310 may have lengths in a first direction and a second direction. The length in the first direction of the first metal layer 310 may be the same as or different from the length in the second direction. In addition, the lengths in the first and second directions of the first metal layer 310 may be different from the lengths in the first and second directions of the first frame 210 exposed by the cavity 170. For example, as shown in FIG. 21, the length in the first direction of the first metal layer 310 may be shorter than the length in the first direction of the first frame 210. In addition, the length in the second direction of the first metal layer 310 may be shorter than the length in the second direction of the first frame 210. In addition, although not shown in the drawing, the length in the first direction of the first metal layer 310 may be shorter than the length in the first direction of the first frame 210, and the length in the second direction of the first metal layer 310 may correspond to the length in the second direction of the first frame 210. Alternatively, the length in the first direction of the first metal layer 310 may correspond to the length in the first direction of the first frame 210, and the length in the second direction of the first metal layer 310 may be shorter than the length in the second direction of the first frame 210. Accordingly, an area of the first metal layer 310 may be smaller than that of the upper surface of the first frame 210 in the cavity 170. In addition, the first metal layer 310 may be disposed to be spaced apart from the second body portion 120. Accordingly, a part of the upper surface of the first frame 210 may be exposed in the cavity 170.

The second metal layer 320 may be disposed to be spaced apart from the first metal layer 310. The second metal layer 320 may be disposed on the second frame 220. The second metal layer 320 may be disposed at a position vertically overlapped with the second frame 220. The second metal layer 320 may be disposed on the body 100. For example, the second metal layer 320 may be disposed on the upper surface of the first body portion 110 exposed by the cavity 170. In addition, the second metal layer 320 may be disposed on the inner surface and the upper surface of the second body portion 120. In addition, the second metal layer 320 may be disposed on the partition wall portion 130. The second metal layer 320 may be disposed on the first surface 131 and the second surface 132 of the partition wall portion 130. For example, the second metal layer 320 may be disposed on the entire region of the first surface 131 and a partial region of the second surface 132.

The second metal layer 320 may be connected to each other and disposed on the upper surface of the second frame 220, a part of the upper surface of the first body portion 110, the first surface 131 of the partition wall portion 130, the second surface 132 of the partition wall portion 130, the first to fourth inner surfaces IS1, IS2, IS3, and IS4, and the upper surface of the second body portion 120.

The first and second metal layers 310 and 320 may be spaced apart from each other. In addition, the second metal layer 320 may be spaced apart from the first frame 210. The second metal layer 320 may have a third distance d3 defined as a distance in the first direction between the exposed first frame 210 and the second metal layer 320. The third distance d3 may be about 10 μm to about 180 μm. In detail, the third distance d3 may be about 15 μm to about 160 μm. Preferably, the third distance d3 may be about 20 μm to about 150 μm.

In addition, the second metal layer 320 may have a fourth distance d4 defined as a distance in the first direction between the first metal layer 310 and the second metal layer 320. The fourth distance d4 may be larger than the third distance d3. The fourth distance d4 may be about 1.1 to 2 times the third distance d3. In detail, the fourth distance d4 may be about 1.1 to 1.6 times the third distance d3. Accordingly, a part of the upper surface of the first frame 210 may be exposed.

The above-described through portion 150 may be disposed between the first and second metal layers 310 and 320. The through portion 150 may be disposed on the first body portion 110 and the first frame 210. For example, the through portion 150 may be disposed on the separation portion of the first body portion 110. In addition, the through portion 150 may be disposed on the first frame 210 exposed by the first metal layer 310. In addition, the through portion 150 may be disposed on the partition wall portion 130. The through portion 150 may be disposed on the second surface 132. The through portion 150 may be spaced apart from the second body portion 120. For example, the through portion 150 may be spaced apart from the first to fourth inner surfaces IS1, IS2, IS3, and IS4.

The through portion 150 may be positioned at a circumference of the first frame 210 of the lower surface of the cavity 170 and the first metal layer 310. For example, as shown in FIG. 20, the through portion 150 may have a predetermined width, and may be disposed surrounding the circumference of the first metal layer 310 and the first frame 210. The through portion 150 may be disposed on the entire region of the circumference of the first metal layer 310 and the first frame 210 with the predetermined width. The through portion 150 may expose the upper surface of the body 100 and the first frame 210. For example, the through portion 150 may expose the upper surface of the first body portion 110, the second surface 132 of the partition wall portion 130, and the upper surface of the first frame 210.

Figure 22:
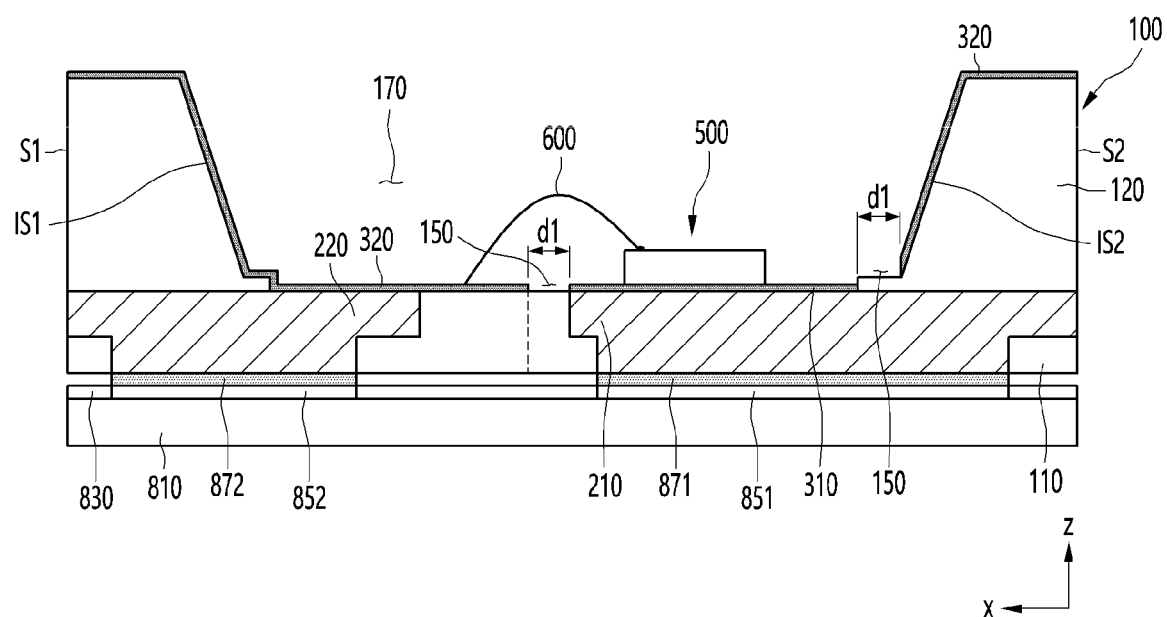
FIGS. 22 and 23 are views illustrating a light source module in which a light-emitting element package according to an embodiment is disposed.
Figure 23:
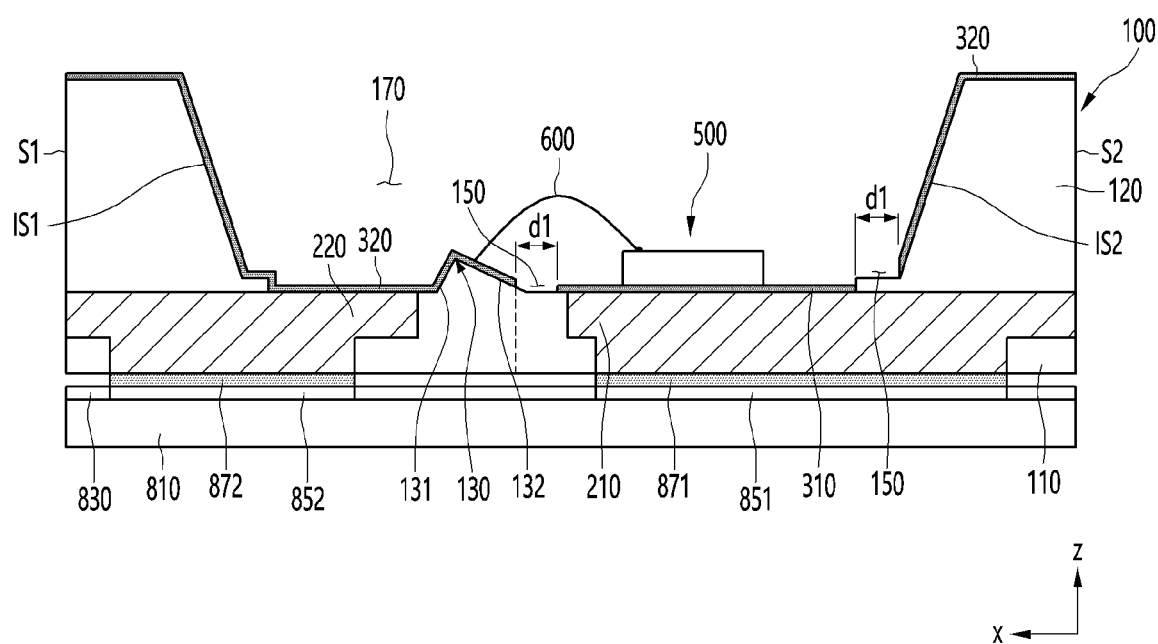

FIGS. 22 and 23 are views illustrating an example in which a light-emitting element package according to an embodiment is disposed on a circuit board, and are views illustrating an example of a light source module.

FIG. 22 is a view illustrating an example in which the light-emitting element package 1000 of FIG. 2 is disposed on the circuit board, and FIG. 23 is a view illustrating an example in which the light-emitting element package 1100 of FIG. 12 is disposed on the circuit board.

Referring to FIGS. 22 and 23, the light source module may include one or a plurality of light-emitting element packages 1000 may be disposed on a circuit board 810. A power supply circuit for controlling driving of the light-emitting element package may be provided on the circuit board 810.

The light-emitting element package may be disposed on the circuit board 810. The circuit board 810 may be a printed circuit board (PCB). The circuit board 810 may include at least one of a resin material PCB, a metal core PCB (MCPCB), a flexible PCB (FPCB), and a rigid PCB. In the circuit board 810, an insulating layer or a protective layer 830 is disposed on a base layer made of resin or metal material, and pads 851 and 852 exposed from the insulating layer or the protective layer 830 are disposed. The pads 851 and 852 may electrically connect one or the plurality of light-emitting element packages. The insulating layer or the protective layer 830 may be made of a solder resist material or a resin material.

The light-emitting element package may be disposed so as to face an upper surface of the circuit board 810. For example, a bottom surface of the light-emitting element package may be disposed so as to face the upper surface of the circuit board 810. In detail, bottom surfaces of the first and second frames 210 and 220 may be disposed so as to face the upper surface of the circuit board 810.

The pads 851 and 852 may include at least one material selected from the group consisting of Ti, Cu, Ni, Au, Cr, Ta, Pt, Sn, Ag, P, Fe, Sn, Zn, and Al, or an alloy thereof.

The pads 851 and 852 may include a first pad 851 and a second pad 852. The pads 851 and 852 may include the first pad 851 and the second pad 852 spaced apart from each other. The first pad 851 may be disposed at a position corresponding to the first frame 210 in a vertical direction (a third direction). The second pad 852 may be disposed at a position corresponding to the second frame 220 in the vertical direction (the third direction).

The first pad 851 may be electrically connected to the first frame 210, and the second pad 852 may be electrically connected to the second frame 220. In addition, a first conductive portion 871 may be disposed between the first pad 851 and the first frame 210, and the second conductive portions 872 may be disposed between the second pad 852 and the second frame 220. The first conductive portion 871 and the second conductive portion 872 may be disposed to be spaced apart from each other. In detail, the first conductive portion 871 and the second conductive portions 872 may be separated physically, thereby preventing electrical short-circuit between the first and second conductive portions 871 and 872.

The conductive portions 871 and 872 may include one material selected from the group consisting of Ag, Au, Pt, Sn, and Cu, or an alloy thereof. The conductive portions 871 and 772 may include a solder paste, an Ag paste, and a SAC (Sn—Ag—Cu) paste. The conductive portions 871 and 872 may be combined with a material constituting the frames 210 and 220 and/or the pads 851 and 852 to be coupled by an intermetallic compound layer. The intermetallic compound may include at least one of $Cu_xSn_y$, $Ag_xSn_y$, and $Au_xSn_y$, and x may satisfy a condition of $0<x<1$, $y=1-x$, $x>y$.

The conductive portions 871 and 872 made of a liquid material are positioned on the first pad 851 and the second pad 852 of the circuit board 810, and then they are coupled to the light-emitting element packages 1000 and 1100 arranged on the circuit board 810. At this time, the first conductive portions 871 disposed on the first pad 851 and the second conductive portions 872 disposed on the second pad 852 may be coupled to the first frame 210 and the second frame 220. The first conductive portion 871 may be in direct contact with the first pad 851 and the first frame 210. The second conductive portions 872 may be in direct contact with the second pad 852 and the second frame 220. Accordingly, the first frame 210 may be electrically connected to the first pad 851, and the second frame 220 may be electrically connected to the second pad 852.

Figure 24:
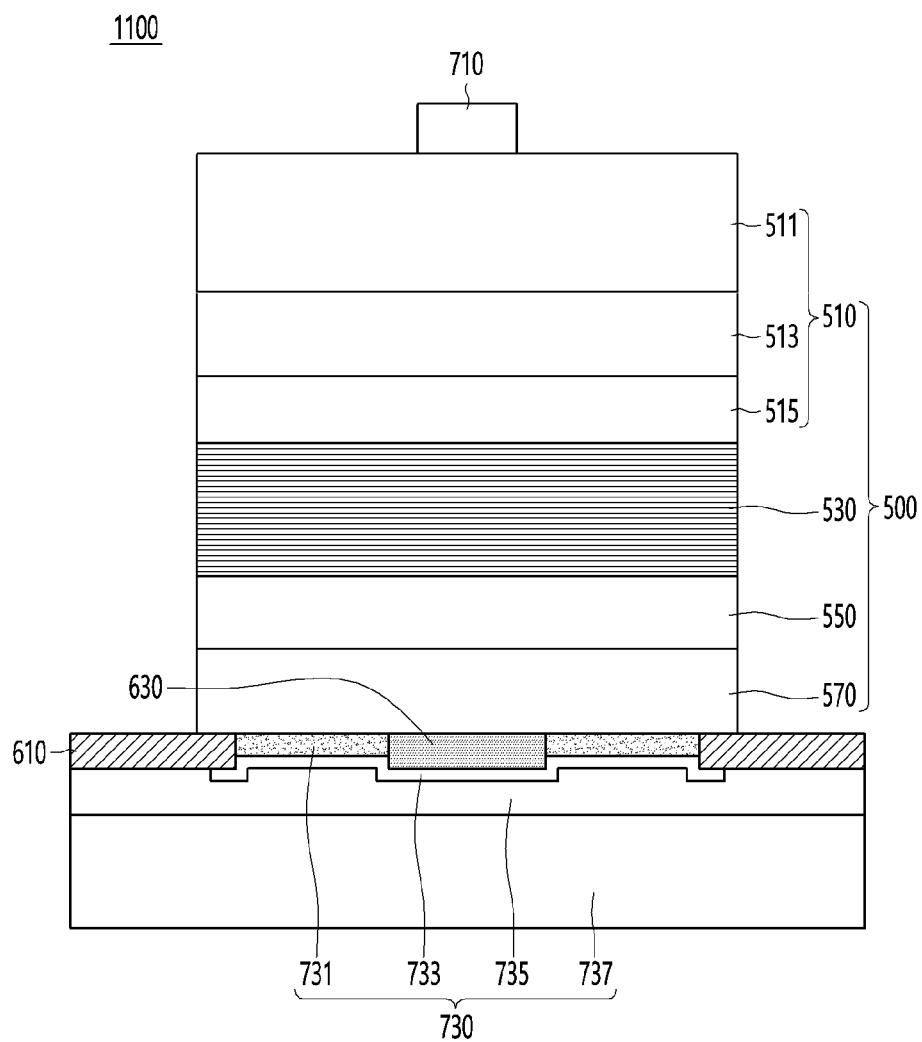
FIG. 24 is a view illustrating an example of a light-emitting device applied to a light-emitting element package according to an embodiment.

FIG. 24 is a view illustrating an example of a light-emitting device applied to a light-emitting element package according to an embodiment.

Referring to FIG. 24, a light-emitting device 500 according to an embodiment may include a light-emitting structure 510, a first electrode 710, and a second electrode 730.

The light-emitting structure 510 may include a first conductive type semiconductor layer 511, an active layer 513, and a second conductive type semiconductor layer 515.

The first conductive type semiconductor layer 511 may include the Group II-VI or Group III-V compound semiconductors. For example, the first conductive type se miconductor layer 511 may include at least one of GaN, InN, AlN, InGaN, AlGaN, InAl GaN, and AlInN. The first conductive type semiconductor layer 511 may be doped with a first dopant. The first dopant may be an n-type dopant such as Si, Ge, Sn, Se, and Te.

The active layer 513 may be disposed under the first conductive type semiconductor layer 511. The active layer 513 may include the Group II-VI or Group III-V compound semiconductors. In addition, the active layer 513 may include any one of a single well structure, a multi-well structure, a quantum dot structure, and a quantum wire structure. When the active layer 513 is implemented in the multi-well structure, a plurality of well layers and a plurality of barrier layers may be stacked in the active layer. For example, the active layer may include at least one selected from the group consisting of GaN/InGaN, GaN/AlGaN, AlGaN/InGaN, AlGaN/GaN, InGaN/InGaN, and InAlGaN/InAlGaN as the barrier layer/well layer.

The second conductive type semiconductor layer 515 may be disposed under the active layer 513. The second conductive type semiconductor layer 515 may include the Group II-VI or Group III-V compound semiconductors. For example, the second conductive type semiconductor layer 515 may include at least one of GaN, InN, AlN, InGaN, AlGaN, InAlGaN, and AlInN. The second conductive type semiconductor layer 515 may be doped with a second dopant. The second dopant may be a p-type dopant such as Mg, Zn, Ca, Sr, and Ba.

The first electrode 710 may be disposed on the light-emitting structure 510. The first electrode 710 may be disposed on the first conductive type semiconductor layer 511. The first electrode 710 may be electrically connected to the first conductive type semiconductor layer 511.

The first electrode 710 may be disposed in different regions, and may be formed with an arm pattern or a bridge pattern, but the embodiment is not limited thereto. A partial region of the first electrode 710 may be used as a pad to which the wire 600 is bonded.

The first electrode 710 may be selected from Ti, Ru, Rh, Ir, Mg, Zn, Al, In, Ta, Pd, Co, Ni, Si, Ge, Ag, and Au, and a selective alloy thereof.

The second electrode 730 may be disposed under the light-emitting structure 510. The second electrode 730 may be disposed under the second conductive type semiconductor layer 515. The second electrode 730 may be electrically connected to the second conductive type semiconductor layer 515. In detail, the second electrode 730 including a plurality of conductive layers 731, 733, 735, and 737 may be disposed under the second conductive semiconductor layer 570. The second electrode 730 may include a contact layer 731, a reflective layer 733, a bonding layer 735, and a support member 737.

The contact layer 731 may contact the second conductive type semiconductor layer 570. The contact layer 731 may include a low conductive material such as ITO, IZO, IZTO, IAZO, IGZO, IGTO, AZO, and ATO, or may include a metal such as Ni and Ag.

The reflective layer 733 may be disposed under the contact layer 731. The reflective layer 733 may include a metal. For example, the reflective layer 733 may include at least one material composed of a material selected from the group consisting of Ag, Ni, Al, Rh, Pd, Ir, Ru, Mg, Zn, Pt, Au, Hf, and combinations thereof. The reflective layer 733 may contact a lower portion of the second conductive type semiconductor layer 570, and may be disposed to be spaced apart from each other, but the embodiment is not limited thereto.

The bonding layer 735 may be disposed under the reflective layer 733. The bonding layer 735 may be used as a barrier metal or a bonding metal. The bonding layer 735 may include at least one of Ti, Au, Sn, Ni, Cr, Ga, In, Bi, Cu, Ag, and Ta, and a selective alloy thereof.

A channel layer 610 and a current blocking layer 630 may be disposed between the second conductive type semiconductor layer 570 and the second electrode 730.

The channel layer 610 may be formed along an edge of a lower surface of the second conductive type semiconductor layer 570, and may be formed in a ring shape, a loop shape, or a frame shape. The channel layer 610 may include a transparent conductive material or an insulating material, for example, and may include at least one of ITO, IZO, IZTO, IAZO, IGZO, IGTO, AZO, ATO, SiO2, SiOx, SiOxNy, Si3N4, Al2O3, and TiO2. An inner portion of the channel layer 610 may be disposed under the second conductive type semiconductor layer 570, and an outer portion of the channel layer 610 may be disposed further outside than a side surface of the light-emitting structure 500.

The current blocking layer 630 may be disposed between the second conductive type semiconductor layer 570 and the contact layer 731 or the reflective layer 733. The current blocking layer 630 may include an insulating material, and for example, may include at least one of SiO2, SiOx, SiOxNy, Si3N4, Al2O3, and TiO2. As another example, the current blocking layer 630 may be formed of a metal for Schottky contact.

The current blocking layer 630 may be disposed so as to correspond to the first electrode 710 in a vertical direction. The current blocking layer 630 may block a current supplied from the second electrode 730 to diffuse it to another path. The current blocking layers 630 may be disposed in one or more, and at least a part or the entire region thereof may be vertically overlapped with the first electrode 710.

The support member 737 may be disposed under the bonding layer 735. The support member 737 may be formed of a conductive member, and the material may be formed of a conductive material such as copper (Cu), gold (Au), nickel (Ni), molybdenum (Mo), copper-tungsten (Cu— W), a carrier wafer (e.g., Si, Ge, GaAs, ZnO, SiC, etc.). As another example, the support member 737 may be implemented as a conductive sheet.

That is, the light-emitting element package 1000 according to the embodiment may minimize that light emitted from the light-emitting device 500 is incident on the body 100 by disposing the metal layers 310 and 320 disposed on the body 100. Accordingly, the body 100 may include various materials, and may improve reliability. In addition, in the embodiment, the metal layers 310 and 320 may be disposed on the body 100 to effectively reflect the light emitted from the light-emitting device 500. Further, the partition wall portion 130 may be further disposed on the body 100 and the metal layers 310 and 320 may be disposed on the partition wall portion 130 to improve light efficiency and luminous flux of the light-emitting element package.

In addition, the embodiment may provide a heat dissipation path by disposing a metal layer between the frame and the light-emitting device 500. Accordingly, it is possible to improve heat dissipation characteristics of the light-emitting element package 1000.

In addition, in the embodiment, the through portion 150 may be formed between the metal layers 310 and 320 having different polarities to prevent an electric short from occurring between the metal layers having different polarities and the frame.

In addition, the through portion 150 may be formed on the partition wall portion 130 to reduce a linear distance between both ends of a wire connecting the light-emitting device 500 and the metal layer, and a height difference between the both ends. Accordingly, it is possible to prevent an open failure of the wire 600 connecting the light-emitting device 500 and the metal layer 320, and to improve the reliability.

The characteristics, structures and effects described in the embodiments above are included in at least one embodiment, but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the embodiment.

In addition, the above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the present invention defined in the appended claims.

The invention claimed is:

1. A light-emitting element package comprising:
a body including a cavity;
first and second frames disposed on a bottom surface of the cavity;
a first metal layer disposed on the first frame;
an ultraviolet light-emitting element disposed on the first metal layer; and
a second metal layer disposed on the second frame and electrically connected to the second frame,
wherein the body includes a separation portion between the first frame and the second frame,
the second metal layer extends over an inclined surface of the cavity and the separation portion of the body, and
the second metal layer is spaced apart from the first metal layer in the cavity and surrounds the first metal layer.

2. The light-emitting element package of claim 1, wherein a through portion separating the first and second metal layers is disposed on the body to surround the first metal layer.

3. The light-emitting element package of claim 2, wherein the inclined surface of the cavity includes first to fourth inner surfaces, and
the first and the second inner surfaces face each other in a first direction and have different inclination angles with respect to an upper surface of the body.

4. The light-emitting element package of claim 3, wherein the through portion is disposed on the inclined surface of the cavity to expose the body.

5. The light-emitting element package of claim 2, wherein a partition wall portion is further disposed on the separation portion of the body, and
the partition wall portion protrudes in an upper direction of the body in the cavity.

6. The light-emitting element package of claim 5, wherein the through portion is disposed on the partition wall portion.

7. The light-emitting element package of claim 5, wherein the first and second metal layers are disposed to be spaced apart from each other on the partition wall portion.

8. The light-emitting element package of claim 5, wherein the first metal layer is disposed on the partition wall portion, and
the second metal layer is disposed to be spaced apart from the partition wall portion.

9. The light-emitting element package of claim 5, wherein the partition wall portion includes:
a first surface adjacent to the first frame and facing the light-emitting element; and
a second surface adjacent to the second frame, and
an inclination angle of each of the first and second surfaces with respect to the upper surface of the body is different from each other.

10. The light-emitting element package of claim 2, wherein a width of the through portion is constant.

11. The light-emitting element package of claim 1, wherein the body includes:
a first body portion; and
a second body portion disposed on the first body portion and providing the cavity on the first body portion,
the first metal layer is spaced apart from an upper surface of the second body portion, and
the second metal layer is disposed on the upper surface of the second body portion.

12. The light-emitting element package of claim 9, wherein the first surface includes at least one of a flat surface and a curved surface, and
the second surface includes a flat surface.

13. The light-emitting element package of claim 5, wherein a height of the partition wall portion is higher than a thickness in a vertical direction of the ultraviolet light-emitting element.

14. The light-emitting element package of claim 5, wherein an area of the first frame exposed by the cavity is larger than that of the second frame exposed by the cavity.

15. The light-emitting element package of claim 3, wherein the first metal layer is spaced apart from the first to fourth inner surfaces, and
the second metal layer is disposed on the upper surface of the body and the first to fourth inner surfaces.

16. The light-emitting element package of claim 15, wherein a length in the first direction and a length in a second direction perpendicular to the first direction of the first metal layer correspond to lengths in the first and second directions of the first frame exposed by the cavity, respectively, and
the first metal layer is disposed to cover an entire upper surface of the first frame exposed by the cavity.

17. The light-emitting element package of claim 16, wherein an area of the second metal layer is larger than that of the first metal layer.

18. The light-emitting element package of claim 2, wherein the through portion formed by the first and second metal layers being spaced apart in a first direction has a first width defined as a width in the first direction,
the through portion formed by the first and second metal layers being spaced apart in a second direction perpendicular to the first direction has a second width defined as a width in the second direction, and
the first and second widths are the same.

19. The light-emitting element package of claim 3, wherein the body is formed on at least one inner surface of the first to fourth inner surfaces, and a part of the second frame further includes a second cavity exposing more, and a protection element is disposed in the second cavity.

20. The light-emitting element package of claim 2, wherein an area of the first frame exposed by the cavity is larger than that of the first metal layer.

\* \* \* \* \*